US012745648B2

(12) United States Patent
Pietambaram et al.

(10) Patent No.: US 12,745,648 B2
(45) Date of Patent: Sep. 22, 2026

(54) MICROELECTRONIC ASSEMBLY HAVING ANTIFERROMAGNETIC FILM STRUCTURE THEREIN

(71) Applicant: Intel Corporation, Santa Clara, CA (US)

(72) Inventors: Srinivas V. Pietambaram, Chandler, AZ (US); Claudio A. Alvarez Barros, Santiago (CL); Beomseok Choi, Chandler, AZ (US); Gang Duan, Chandler, AZ (US); Jeremy D. Ecton, Gilbert, AZ (US); Brandon Christian Marin, Gilbert, AZ (US); Suddhasattwa Nad, Chandler, AZ (US); Hiroki Tanaka, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 395 days.

(21) Appl. No.: 18/074,253

(22) Filed: Dec. 2, 2022

(65) Prior Publication Data

US 2024/0186270 A1 Jun. 6, 2024

(51) Int. Cl.
*H10W 44/00* (2026.01)
*H01F 10/32* (2006.01)
(Continued)

(52) U.S. Cl.
CPC ...... *H10W 44/501* (2026.01); *H01F 10/3272* (2013.01); *H10W 70/05* (2026.01);
(Continued)

(58) Field of Classification Search
CPC . H01L 23/645; H01L 21/4857; H01L 21/486; H01L 23/49822; H01L 23/49838;
(Continued)

(56) References Cited

U.S. PATENT DOCUMENTS

2003/0053267 A1* 3/2003 Horng .................. G11B 5/3903
2016/0181508 A1* 6/2016 Lee ........................ H10N 50/01
257/421
2024/0047509 A1* 2/2024 Hou .................... H01L 23/5389

OTHER PUBLICATIONS

N. An, A. Jander and P. Dhagat, "Electrically Tunable Thin Film Magnetic Core Using Synthetic Antiferromagnet Structure," in IEEE Transactions on Magnetics, vol. 44, No. 11, pp. 4100-4103, Nov. 2008 (Year: 2008).*

(Continued)

*Primary Examiner* — Evan G Clinton
(74) *Attorney, Agent, or Firm* — Alliance IP, LLC

(57) ABSTRACT

A microelectronic structure, a semiconductor package, an IC device assembly, and a method. The structure includes a core layer including an electrically non-conductive material; electrically conductive through core vias (TCVs) through the core layer; a dielectric layer on the core layer with electrically conductive structures extending therethrough and electrically coupled to the TCVs; and a magnetic inductor (MI) within at least one of the core layer or the build-up layer and including an antiferromagnetic (AF) structure. The AF structure includes a first ferromagnetic (FM) layer; an exchange coupling (EC) layer on the first FM layer and including a non-magnetic metal material; a second FM layer on the EC layer, the EC layer between the first FM layer and the second FM layer; and a pinning (P) layer including manganese and at least one of platinum or iridium, the second FM layer between the EC layer and the P layer.

20 Claims, 7 Drawing Sheets

(51) Int. Cl.
*H10W 70/05* (2026.01)
*H10W 70/65* (2026.01)
*H10W 70/685* (2026.01)
*H10W 90/00* (2026.01)

(52) U.S. Cl.
CPC ......... *H10W 70/095* (2026.01); *H10W 70/65* (2026.01); *H10W 70/685* (2026.01); *H10W 90/00* (2026.01)

(58) Field of Classification Search
CPC ............. H01F 10/3272; H01F 10/3268; G11C 2211/5615; G11C 1/161; H10N 50/10; H10W 44/501; H10W 70/05; H10W 70/095; H10W 70/65; H10W 70/685; H10W 90/00; H10W 90/701
See application file for complete search history.

(56) References Cited

OTHER PUBLICATIONS

Bhatt, Ramesh & Ye, Lin-Xiu & Wang, Zhen-Yue & Wu, Te-Ho. (2020). Magnetic Properties of Orthogonal Magnetic Tunnel Junction Made by IrMn- and PtMn-based Synthetic Antiferromagnet. Sep. 2020 2. 1-7. 10.29424/JIT.202009_2(2).0001. 8 pages.

Wang, J., et al. "Exchange Coupling between Ferro- and Antiferromagnetic Layers across a Non-Magnetic Interlayer: Co/Cu/FeMn on Cu(001)." Journal of Physics: Condensed Matter, vol. 16, No. 50, Dec. 2004, pp. 9181-9190. DOI.org (Crossref), https://doi.org/10.1088/0953-8984/16/50/009, 10 pages.

* cited by examiner

MICROELECTRONIC ASSEMBLY HAVING ANTIFERROMAGNETIC FILM STRUCTURE THEREIN

TECHNICAL FIELD

This disclosure relates generally to microelectronic assemblies having magnetic material in package substrates thereof.

BACKGROUND

Magnetic Core Inductors (MCIs) are sometimes used as integrated voltage regulators in order to increase the power delivery efficiency and enhance current flow through electrically conductive pathways of a substrate. MCIs may be coupled to electrically conductive pathways of the substrate in order to bring about the noted benefits. The substrates used have typically included organic core package substrates with coaxial MCIs. Coaxial MCIs rely on drilling relatively large vias, for example with diameters above 300 microns, into the core, filling it with a magnetic paste, drilling through the magnetic material obtained from the paste, plating the resulting walls of the magnetic material, and resin plugging the same. Glass cores however are moving towards vias smaller than 300 microns, and therefore toward finer via to via pitches. As devices scale, it becomes difficult to provide MCIs for power delivery efficiency, as smaller vias would mean thinner magnetic materials presenting a challenge regarding sufficient magnetic permeability, magnetic field strength and magnetic flux density in order to bring about the expected power delivery efficiencies of a MCI.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
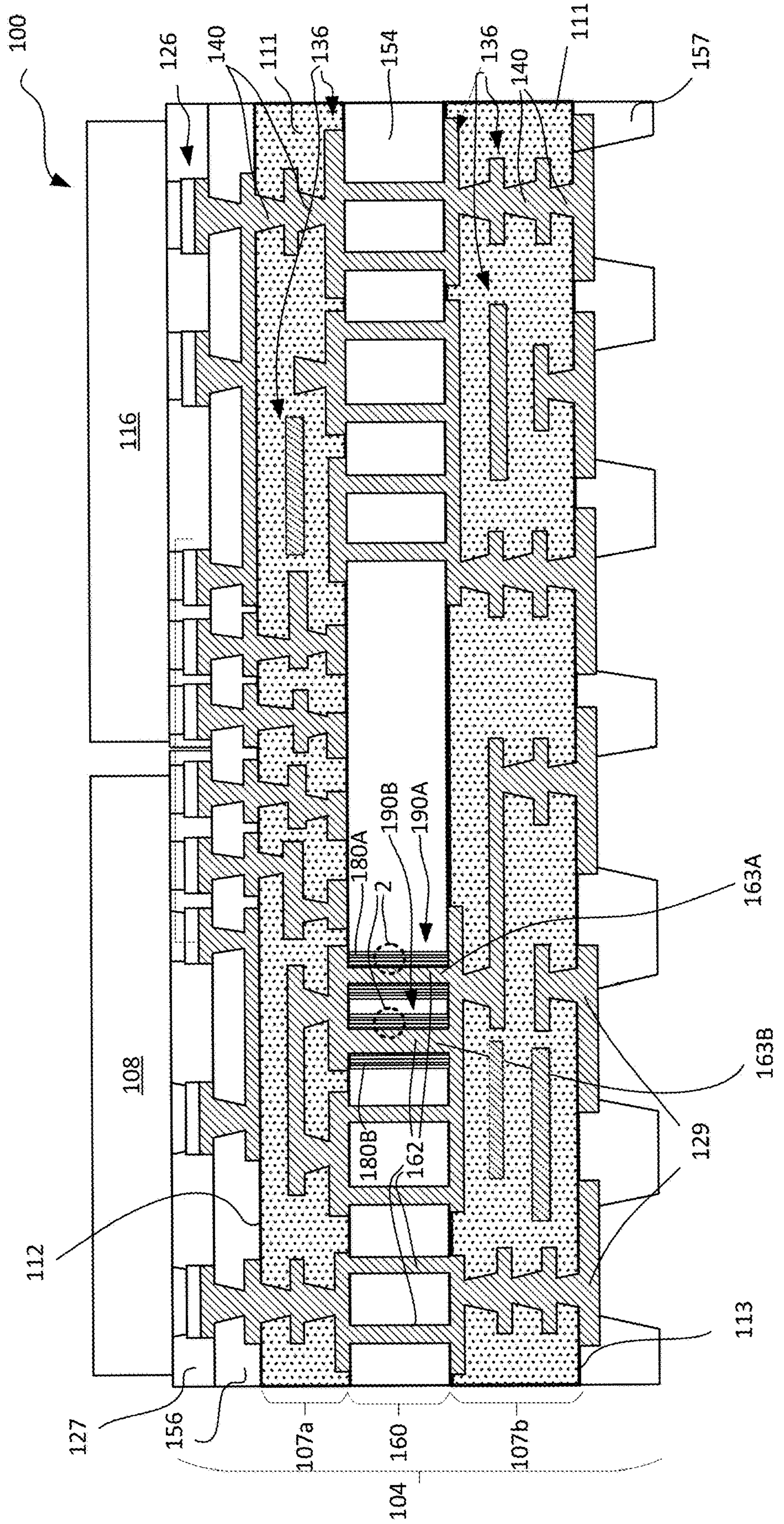
FIG. 1 is a cross sectional image of a microelectronic assembly including coaxial MIs therein.

The following description and the drawings sufficiently illustrate specific embodiments to enable those skilled in the art to practice them. Other embodiments may incorporate structural, logical, electrical, process, and other changes.

Portions and features of some embodiments may be included in, or substituted for, those of other embodiments. Embodiments set forth in the claims encompass all available equivalents of those claims. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

The technologies described herein may be implemented in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including semiconductor packages with passive heat spreaders, interface layers, TIMs, top dies, side dies, substrates, and package substrates.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

As used herein, reference to a "die" is meant to broadly refer to a die, a chiplet, a chip complex, a chiplet complex, or any other integrated circuit structure including circuitry therein supported on a substrate. While the terms die, chip, and chiplet may be used interchangeably, the term chiplet is sometimes used to refer to an integrated circuit die that implements a subset of the functionality of a larger integrated circuit component, the larger integrated circuit component formed using one or more chiplets connected by inter-die interconnects (e.g., interposers, bridges, local interconnect components, local silicon interconnects). The use of chiplets in integrated circuit components has become attractive as feature sizes have reduced and the demand for high-performance larger integrated circuit components has increased. The approach of assembling multiple known-good dies (chiplets) to form a larger integrated circuit component results in improved manufacturing efficiencies as the overall yield of an integrated circuit component assembled from multiple small chiplets is better than that of an integrated circuit component in which the functionality of the chiplets is implemented on a single large integrated circuit die. Any integrated circuit die, chip, or chiplet can implement any portion of the functionality of any processor unit described or referenced herein.

As used herein, the term "electronic component" can refer to an active electronic circuit (e.g., processing unit, memory, storage device, FET) or a passive electronic circuit (e.g., resistor, inductor, capacitor).

As used herein, the term "the material" of component A may refer to one or to more constituent materials of component A. For example, where component A includes 3 sublayers made of three respective materials X, Y and Z, the disclosure herein may refer to "the material of component A" to refer to materials X, Y and Z that make up component A.

As used herein, the term "electrically conductive pathway" refers to one or more electrically conductive structures such as redistribution layers, traces, vias, contacts, metallization layer coatings, metallization layers, contacts, solder balls, or any structure that is to conduct electricity between two distinct locations.

As used herein, the term "horizontally extending electrically conductive structure" refers to one or more electrically conductive structures that extend horizontally within a electronic component, such as within a package substrate. Examples of horizontally extending electrically conductive structures include traces, contacts, or pads.

As used herein, the term "integrated circuit component" can refer to an electronic component on a semiconducting material configured to perform a function. An integrated circuit (IC) component can comprise one or more of any computing system components described or referenced herein or any other computing system component, such as a processor unit (e.g., system-on-a-chip (SoC), processor core, graphics processor unit (GPU), accelerator, chipset processor), I/O controller, memory, or network interface controller, and can comprise one or more additional active or passive devices such as capacitors, decoupling capacitors, resistors, inductors, fuses, diodes, transformers, sensors, electrostatic discharge (ESD) devices, and memory devices.

As used herein, "pitch" may be measured center-to-center between two elements (e.g., from a center of a TCV to a center of an adjacent TCV).

A non-limiting example of an unpackaged integrated circuit component includes a single monolithic integrated circuit die (shortened herein to "die"); the die may include solder bumps attached to contacts on the die. When present on the die, the solder bumps or other conductive contacts can enable the die to be directly attached to a printed circuit board (PCB) or other substrates.

A non-limiting example of a packaged integrated circuit component comprises one or more integrated circuit dies mounted on a package substrate with the integrated circuit dies and package substrate encapsulated in a casing material, such as a metal, plastic, glass, or ceramic. Often the casing includes an integrated heat spreader (IHS); the packaged integrated circuit component often has bumps, leads, or pins attached to the package substrate (either directly or by wires attaching the bumps, leads, or pins to the package substrate) for attaching the packaged integrated circuit component to a printed circuit board (or motherboard or base board) or another component.

The following detailed description is not intended to limit the application and use of the disclosed technologies. It may be evident that the novel embodiments can be practiced without every detail described herein. For the sake of brevity, well-known structures and devices may be shown in block diagram form to facilitate a description thereof.

For convenience, a phrase referring to element "X," where X is a reference numeral, may be used to refer to any one of elements XA-XB if elements have been disclosed as such. For example, the phrase "synthetic AF structure 180" is used herein to refer to any one of synthetic AF structures 180.

For convenience, a phrase referring to elements "X," where X is a reference numeral, may be used to refer to the collection elements XA-XB where elements XA-XB have been disclosed. For example, the phrase "synthetic AF structures 180" is used herein to refer to synthetic AF structures 180.

Microelectronic assemblies, and related devices and methods, are disclosed herein. For example, in some embodiments, a microelectronic assembly may include a package substrate having a plurality of conductive through-glass vias (TGV); and a magnetic inductor (MI) including a synthetic antiferromagnetic (synthetic AF) structure. The synthetic AF structure includes a metallic exchange coupling layer between two ferromagnetic layers.

In one embodiment, the MI may include a coaxial MI which comprises conductive through substrate via (TsubV) surrounded by the synthetic AF structure, where the synthetic AF structure corresponds to coaxial magnetic inductor layers (MILs).

In another embodiment, the MI may include a planar MI integrated with or mounted into/on a package substrate.

Microelectronic assemblies are moving towards smaller and smaller through vias, and therefore toward finer and finer via to via pitches. As devices scale, it becomes difficult to provide device MCIs as integrated voltage regulators for power delivery efficiency. The induction generated by a MI is dependent on the magnetic permeability of the magnetic material associated with them, and further on the volume of the magnetic material. As devices scale, and as their vias scale, so should the magnetic material provided for any MIs therein. Doing so while ensuring the magnetic saturation threshold and the magnetic permeability for the magnetic material, and hence for the MI, becomes challenging. Smaller vias would mean thinner magnetic materials presenting a challenge regarding sufficient magnetic permeability, magnetic field strength and magnetic flux density in order to bring about the expected power delivery efficiencies of a MI.

According to embodiments, thin film MIs may be provided exhibiting high enough magnetic permeability $\mu_r$, while keeping the magnetic field strength at saturation Hsat and the flux density at saturation Bk as high as can be done to keep the current carrying capacity of an associated electrically conductive structure (such as a via) in the substrate as high as possible.

A thin film MI according to some embodiments may include a synthetic antiferromagnetic (AF) structure. The synthetic AF structure may include two ferromagnetic (FM) layers, an exchange coupling layer (EC layer) therebetween, and a pinning (P) layer adjacent one of the two FM layers, such that said one of the two FM layers is between the EC layer and the P layer.

The antiferromagnetic property of a synthetic AF structure according to some embodiments may be exhibited by, in the absence of an external magnetic field applied to the synthetic AF structure (such as by current flowing through an electrically conductive structure coupled to the synthetic AF structure), a magnetic field m1 in a first one of the two FM layers has a direction (magnetization direction) that is opposite a direction of a magnetic field (magnetization direction) m2 in a second one of the two FM layers. In this manner, m1 and m2 cancel each other out, with a magnetic field of the synthetic AF structure, which is based on m1 and m2, when not exposed to an external magnetic field being zero.

The synthetic property of the synthetic AF structure may be imparted to it by the PL, which keeps the magnetization direction of m2 in the FM layer closest to it (that is, in the second FM layer 204) substantially fixed. The material of the PL, which may include manganese, or manganese along with at least one of platinum or iridium, keeps the direction of m2 fixed (the magnetic field of the FM layer closest to the PL), regardless of external magnetic fields applied to the synthetic AF. In that case, by virtue of the coupling, through the EC layer, between the first and second FM layers, it is m1 that may switch its direction when exposed to an external magnetic field that is above a given threshold, while m2 says fixed in its magnetization direction.

Various embodiments disclosed herein may help achieve reliable and efficient power delivery to multiple dies while increasing inductance density. The microelectronic assemblies disclosed herein may be particularly advantageous for high end computing applications needing high power and large Form Factors where glass substrates may reduce warpage and increase durability.

FIG. 1 is a side, cross-sectional view of an example microelectronic assembly 100, in accordance with a first embodiment. The microelectronic assembly 100 may include a microelectronic structure in the form of a package substrate 104, along with dies 108 and 116 coupled to the microelectronic structure. The microelectronic assembly 100 of FIG. 1 may also include an underfill material 127.

Package substrate 104, which includes a core 154 and build-up layers 107*a* and 107*b*, is shown together with coaxial MIs 190A and 190B integrated or embedded therein. The package substrate 104, in the shown example, corresponds to an example of a "microelectronic structure" as referred to herein.

The core layer 154 may include a non-conductive layer as well. The non-conductive layers may include a non-conductive material, such as glass, silicon or an organic material. A glass core as compared to a conventional epoxy core may offer several advantages including a higher plated through hole (PTH) density, lower signal losses, lower total thickness variation (TTV), among others.

The build-up layers may include successive non-conductive layers and successive metal layers (or redistribution layers (RDLs); e.g. M1, M2, . . . Mn) between the dielectric layers. RDLs include horizontally extending electrically conductive structures extending through the sublayers to conduct electrical signals therethrough. Persons with skill in the art may appreciate that the distinctions in the various build-up layers attributed to the build-up layers 107*a*-107*b* in this discussion have been introduced for illustrative purposes; in a cross-sectional image of the substrate 104, such as by a transmission electron microscope (TEM), the layers 107*a*-107*b* may each include multiple layers, and/or may be different from the ones shown in the figure, and there may be more or less of the build-up layers than the ones shown.

Electrically conductive structures within the package substrate 104 provide signal communication for die 108 and die 116. Electrically conductive structures of the substrate 104 may include RDLs in the form of horizontally extending electrically conductive structures 136 (including for example contacts), and vias 140. Horizontally extending electrically conductive structures 136 may be arranged to route electrical signals in a horizontal direction, and vias 140 may be arranged to route electrical signals in a vertical direction. The electrically conductive structures may include an electrically conductive material such as a metal (e.g., copper, aluminum, nickel, cobalt, iron, tin, gold, silver, or combinations thereof).

Package substrate 104 may further include a passivation layer 156 in the form of solder resist or other dielectric material on the upper substrate surface 112 of substrate 104 may be patterned with respective pinouts (physical arrangement of conductive contacts 126 at a respective pitch) for individual dies such as dies 108 and 116.

Package substrate 104 may also include a passivation layer 157 in the form of solder resist or other dielectric material on the lower substrate surface 113 of substrate 104 may also be patterned with a respective pinouts (physical arrangement of conductive contacts 129 at a respective pitch) for electrical coupling of the microelectronic assembly 100 to another component, such as a motherboard.

The buildup layers may further include non-conductive layers 111 within which the horizontally extending electrically conductive structures 136 and vias 140 may be embedded. The non-conductive material may include a dielectric material.

Substrate 104 as shown corresponds to a microelectronic structure that may include a core layer 154 as noted. There are through-vias 162 penetrating through the core layer 154 and electrically connecting the plurality of RDLs within the build-up layers 170*a* and 170*b* across the core layer 154. The through-vias 162 correspond to through-core vias (TCVs), which in turn are an example of TsubVs.

The core layer 154 may be a core substrate, and may be disposed in a center region of the substrate 104 in between build-up layers. The core layer 154 may have a multilayer configuration. In this case, a better warpage control effect may be obtained and a plurality of passive components (not shown) may be more easily embedded into the core layer 154. For example, the core layer 154 may include a glass material. For example, the core layer may include a plurality of insulating layers that are bonded together by a plurality of bonding layers disposed therebetween. Bonding layers could also be disposed on the top and bottom surfaces of the core to bond the same to build-up layers 107*b* and 107*a*, respectively. The core layer 154 may include one or more insulating materials, such as, for example, at least one of a thermosetting resin such as an epoxy resin, a thermoplastic resin such as polyimide, or a material including the thermosetting resin and the thermoplastic resin, a glass fiber (or a glass cloth or a glass fabric, an inorganic filler, and/or a reinforcing material such as an inorganic filler, for example, a copper clad laminate (CCL), an unclad CCL, or the like). Alternatively, the material of the core layer 154 may include, for example, a liquid crystal polymer (LCP). Where bonding layers are used, they may include, for example, at least one of a thermosetting resin such as an epoxy resin, a thermoplastic resin such as polyimide, or a material including the thermosetting resin and the thermoplastic resin, a glass fiber, and/or a reinforcing material such as an inorganic filler, for example, prepreg (PPG), Ajinomoto Build-up Film (ABF), and the like.

The package substrate 104 includes integrated coaxial MIs 190A and 190B (coaxial MIs 190) which are integrated into the package structure. The coaxial MIs 190A and 190B may include, respectively, a first conductive through core via (TCV) 163A and a second conductive TCV 163B, each TCV at least partially surrounded by a synthetic AF structure. TCVs 163A and 163B are part of the through vias 162, but are different from other TCVs of the core 154 because they are part of coaxial MIs including respective synthetic AF structures 180. The synthetic AF structures 180 extends at least partially along a height (e.g., z-height or a height) of the first and second conductive TCVs 163A, 163B, respectively. The first TCV 163A may be electrically coupled to the second TCV 163B, although embodiments are not so limited.

Although the package substrate of FIG. 1 is shown as one that includes a core layer, embodiments are not so limited, and include within their scope a package substrate without a core, such as one including silicon.

The coaxial MIs 190A and 190B may improve the performance of the microelectronic assembly 100 by more efficiently delivering power to the one or more dies 108 and 116 across core layer 154 and allowing the pitch between TCVs of a package substrate be reduced while providing effective coaxial MIs integrated therewith.

The TCVs 163A and 163B of the coaxial MIs 190A and 190B may have any suitable size and shape. In some embodiments, the TCSs 163A and 163B may have a circular, rectangular, or other shaped cross-section in a direction transverse to a surface direction of the page showing FIG. 1. In some embodiments, the TCVs 163A and 163B may have a height between 100 microns and 750 microns.

Figure 2:
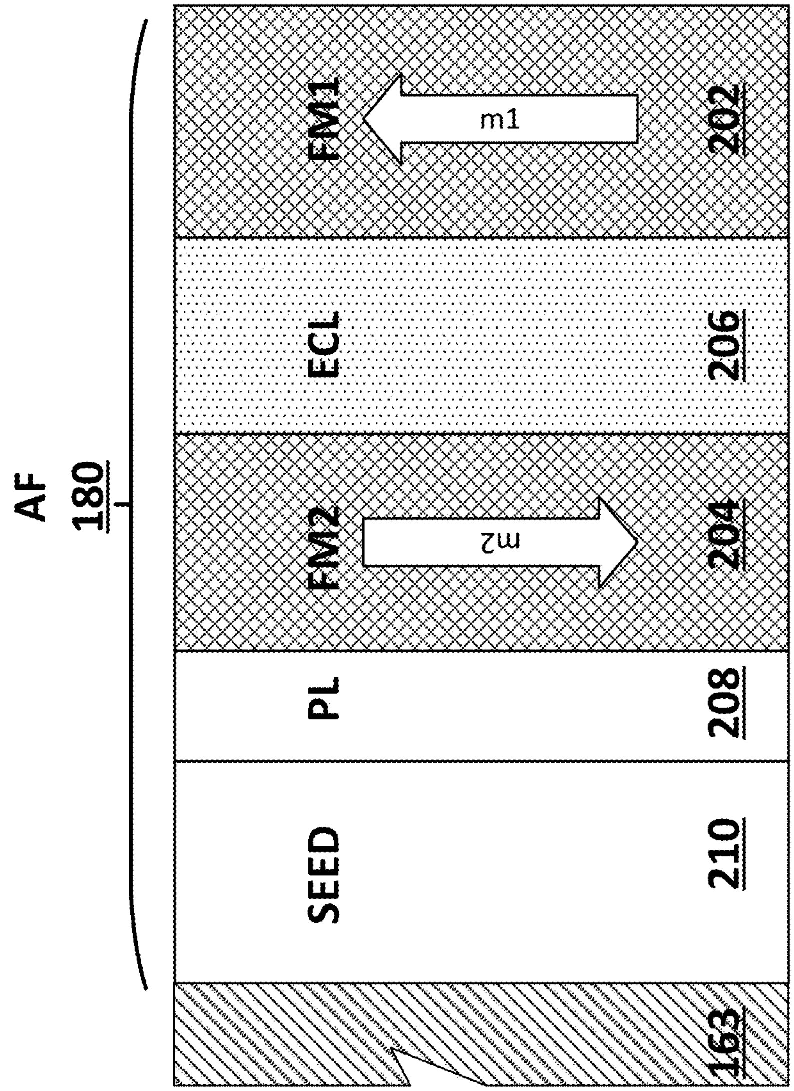
FIG. 2 is a cross sectional view of a portion of the package substrate of FIG. 1 that includes a Synthetic Anti-Ferromagnet (synthetic AF or SAF) film structure.

Reference is now made to both FIGS. 1 and 2. FIG. 2 shows the cross-section of synthetic AF structure 180 in a region marked by a circle shown in broken lines in FIG. 1 and marked with the reference numeral 2. In FIG. 1, the region 2 is shown on both synthetic AF structures 180, because the synthetic AF structure of FIG. 2 is to be understood to show either of the synthetic AF structures 180 of FIG. 1. It is further to be understood that embodiments encompass coaxial MIs 190A and 190B that are different from one another.

As best seen in FIG. 2, a synthetic AF structure 180 may, according to some embodiments, include a multilayer structure 280 surrounding a conductive TCV 163. The multilayer structure 180 may include, according to some embodiments, two ferromagnetic (FM) layers 202 and 204, each of the FM layers including a FM material, and an exchange coupling layer (EC layer) 206 between the two FM layers, such as in contact with the two FM layers. Individual ones of the FM layers 202 and 204 may include any FM material.

For example, individual ones of the FM layers may include at least one of cobalt, iron, nickel or dysprosium. For example, individual ones of the FM layers may include iron, along with one of nickel or cobalt, as an alloy or compound. For example, individual ones of the FM layers may include an alloy that includes iron and at least one of nickel or cobalt. For example, individual ones of the FM layers may include at least one of NiFe or CoFe. For example, individual ones of the FM layers may include an alloy or a compound including iron with at least one of nickel or cobalt, along with another material, such as Boron (e.g., NiFeX or CoFeX). For example, individual ones of the FM layers may include at least one of CoFeB or NiFeB (where X is represented by B in this example). For example, X could include one or more of Zr, Ta, P, S.

Other examples of the FM material may include awaruite, $Ni_3Fe$, or permalloy.

The EC layer 206 may include at least one of Ru, Ta, Cr, Rh or Cu. A thickness of the EC layer may, for example, be between about 7 Angstroms to about 10 Angstroms. Larger or smaller thicknesses are possible according to embodiments.

Individual ones of the synthetic AF structures 180 may further include a P layer 208, which may include manganese, and at least one of platinum or iridium. For example, P layer 208 may include an alloy that includes manganese, and at least one of platinum or iridium. For example, P layer 208 may include at least one of PtMn or IrMn. For example, P layer 208 may include manganese with at least one of platinum or iridium, along with another material.

Individual ones of the synthetic AF structures 180 may further include a seed layer 210, which may include a metal, such as a metal to allow a seeding of the material of the P layer 208 thereon. For example, the seed layer may include Mn, Cu, Ta, Ru, or multi-layers of these metals.

The synthetic AF structure 180 may be formed using any suitable process. A synthetic AF structure 180 may be formed to at least partially surround a TCV 163. In some embodiments, the synthetic AF structure 180 may be formed to completely surround a TCV 163, such that the synthetic AF structure 180 forms a sleeve around the TCV 163.

As used herein, "surrounded" may refer to partly surrounded as well as wholly surrounded. For example, in some embodiments, a "conductive via surrounded by a synthetic AF structure" may refer to a conductive via wholly surrounded by a synthetic AF structure at lateral surfaces thereof (that is, the synthetic AF structure covers the lateral surfaces of the conductive via along a height of the conductive via), or partially surrounded by a synthetic AF structure at lateral surfaces thereof (that is, there is at least one part of the lateral surfaces of the conductive via not covered by the synthetic AF structure). In some embodiments, coaxial MI vias (inclusive of the TCV and of the corresponding synthetic AF structure) may have a width (in a direction parallel to the page and transverse to its height direction) that is between about 100 microns to about 350 microns. In some embodiments, for a coaxial MI vias width of about 350 microns (inclusive of the TCV and of the corresponding synthetic AF structure), the TCV (non-magnetic) may have a width of about 100 microns.

In some embodiments, the package substrate 104 may be formed using a lithographically defined via packaging process. In some embodiments, the package substrate 104 may be manufactured using standard organic package manufacturing processes, and thus the package substrate 104 may take the form of an organic package. In some embodiments, the package substrate 104 may be a set of build-up layers formed on a panel carrier by laminating or spinning a dielectric material onto the carrier (or core), and creating conductive vias and lines by laser drilling or ablation and plating. In some embodiments, the package substrate 104 may be formed on a removable carrier using any suitable technique, such as a build-up layer technique. Any method known in the art for fabrication of the package substrate 104 may be used, and for the sake of brevity, such methods will not be discussed in further detail herein.

In some embodiments, the package substrate 104 may be a lower density medium and the dies 108 and 116 may be higher density mediums, or have areas with a higher density mediums. As used herein, the term "lower density" and "higher density" are relative terms indicating that the conductive pathways (e.g., including conductive interconnects, conductive lines, and conductive vias) in a lower density medium are larger and/or have a greater pitch than the conductive pathways in a higher density medium. In some embodiments, a higher density medium may be manufactured using a modified semi-additive process or a semi-additive build-up process with advanced lithography (with small vertical interconnect features formed by advanced laser or lithography processes), while a lower density medium may be a printed circuit board (PCB) manufactured using a standard PCB process (e.g., a standard subtractive process using etch chemistry to remove areas of unwanted copper, and with coarse vertical interconnect features formed by a standard laser process). In other embodiments, the higher density medium may be manufactured using semiconductor fabrication process, such as a single damascene process or a dual damascene process.

Referring back to FIG. 1, the dies 108 and 116 may each be single-sided or double-sided, and may each be a single-pitch die or a mixed-pitch die. In this context, a double-sided die refers to a die that has connections on both surfaces. In some embodiments, a double-sided die may include through-silicon vias (TSVs) to form connections on both surfaces. The active surface of a double-sided die, which is the surface containing one or more active devices and a majority of interconnects, may face either direction depending on the design and electrical requirements. Although FIG. 1 shows the dies 108 and 116 in a particular arrangement, the dies 108 and 116 may be in any suitable arrangement.

The microelectronic assembly 100 of FIG. 1 may be attached and electrically coupled to a circuit board (not shown). The package substrate 104 may be coupled to the circuit board by second-level interconnects at the bottom surface of the package substrate 104. The second-level interconnects may be any suitable second-level interconnects, including solder balls for a ball grid array arrangement, pins in a pin grid array arrangement or lands in a land grid array arrangement. The circuit board may be a motherboard, for example, and may have other components attached to it. The circuit board may include conductive pathways and other conductive contacts for routing power, ground, and signals through the circuit board, as known in the art. In some embodiments, the second-level interconnects may not couple the package substrate 104 to a circuit board, but may instead couple the package substrate 104 to another IC package, an interposer, or any other suitable component.

In operation, a coaxial MI, such as coaxial MI 190, when an electrical current flows through an associated electrically conductive structure, such as TCV 163, the synthetic AF 180 will be exposed to a magnetic field M caused by the electrical current. The magnetic field M from the current flow has a direction that depends on the direction of current flow through the TCV (e.g., based on the right hand rule and taking into account that the synthetic AF structure surrounds the TCV) may result in an increase in the magnetic flux density and an associated increase (from zero) in the magnetic field strength of the synthetic AF structure, and may change and eventually reverse/flip the magnetization direction of m1 of first FM layer 202 (the changing of magnetization direction of m1 in the first FM layer 202 contributes to impart a magnetic field to the synthetic AF structure 180, the absolute value of which is larger than zero).

For purposes of the instant description, an increase in the magnetic flux density and/or in the magnetic field strength and/or in the magnetic saturation point of the synthetic AF is to refer to an increase in absolute value (e.g., electrical current flow in one direction may cause a decrease in magnetic flux density, and an attendant decrease in magnetic field strength, but only in terms of their sign (going below zero), but not in terms of their absolute values).

The increase may happen until saturation of the magnetic field strength is reached. This increase results in enhanced power delivery and enhanced current flow in the electrically conductive pathway that is associated with the MI, the enhancement being for a same voltage V across the electrically conductive structure, as between an instance where there is no synthetic AF structure coupled to the electrically conductive structure, and where there is a synthetic AF structure coupled to the electrically conductive structure, with the enhancement being related to the latter. In some embodiments, the electrical current through the TCVs is, on a per TCV basis, flow in a single direction, although embodiments are not so limited.

The synthetic AF structure allows, in some embodiments, even for smaller TCVs with a transverse dimension of 100 microns or smaller, a steeper slope between magnetic flux density on the x axis, and magnetic field strength on the y axis, so that, as the current passes through the TCV, for a same voltage bias, the magnetic field strength of the synthetic AF structure may increase faster than the magnetic field strength of a same structure but with a state of the art magnetic material structure. In some embodiments, the synthetic AF structure further allows the above referenced steeper slope while ensuring that the magnetic saturation threshold is kept high for the synthetic AF structure (e.g., is not reached quickly because of the steeper slope). A higher magnetic permeability of the synthetic AF structure as compared with traditional magnetic material structures of MIs can help provide for the higher magnetic saturation threshold. Some of the embodiments herein may achieve the above advantages while keeping the thickness of the synthetic AF relatively small, such as in the order of hundreds of nanometers, such as between about 50 nanometers to about 150 nanometers, such as above 75 nanometers.

According to some embodiments, the ferromagnetic materials of the synthetic AF structure are oriented with respect to the EC layer, the PL, and the electrically conductive structure (TCV) such that the hard axes of the FM layers is substantially parallel to an anticipated direction of current flow within the TCV.

According to some embodiments, the core includes a glass material. Some embodiments however include within their scope the provision of a core including an organic material such as one including a polymer material and fibers therein, or the provision of a core including a silicon material. An advantage of a glass core is that it allows the provision of TCVs having walls with a higher degree of smoothness than that generated in cores made of other materials, and further the provision of TCVs that have tighter pitches than the pitches of TCVs in cores made of other materials.

For the provisions of TCVs in a glass material, laser etching using a laser sensitization technique may be performed, where regions of the glass that are to be provided with holes are first exposed to a laser beam, as a result of which the exposed glass material therein undergoes a phase change. The glass is then subjected to an wet etching process to which the phase changed regions of the glass are more sensitive. As a result, the phase changed regions can be etched away, leaving holes with relatively smooth surfaces. This process is to be contrasted with the provision of through via holes in an organic substrate, which typically involves mechanical drilling. The drilling can result in holes having rough inner surfaces, not amenable to being coated with thin films (such as thin films of an example synthetic AF structure, where the sublayers may have thicknesses in the order of Angstroms). The drilling can further result in cracks propagating within an organic core material if the holes being produced as too close together. The above having been said, embodiments do not preclude the use of synthetic AFs in conjunction with organic cores.

Figure 3:
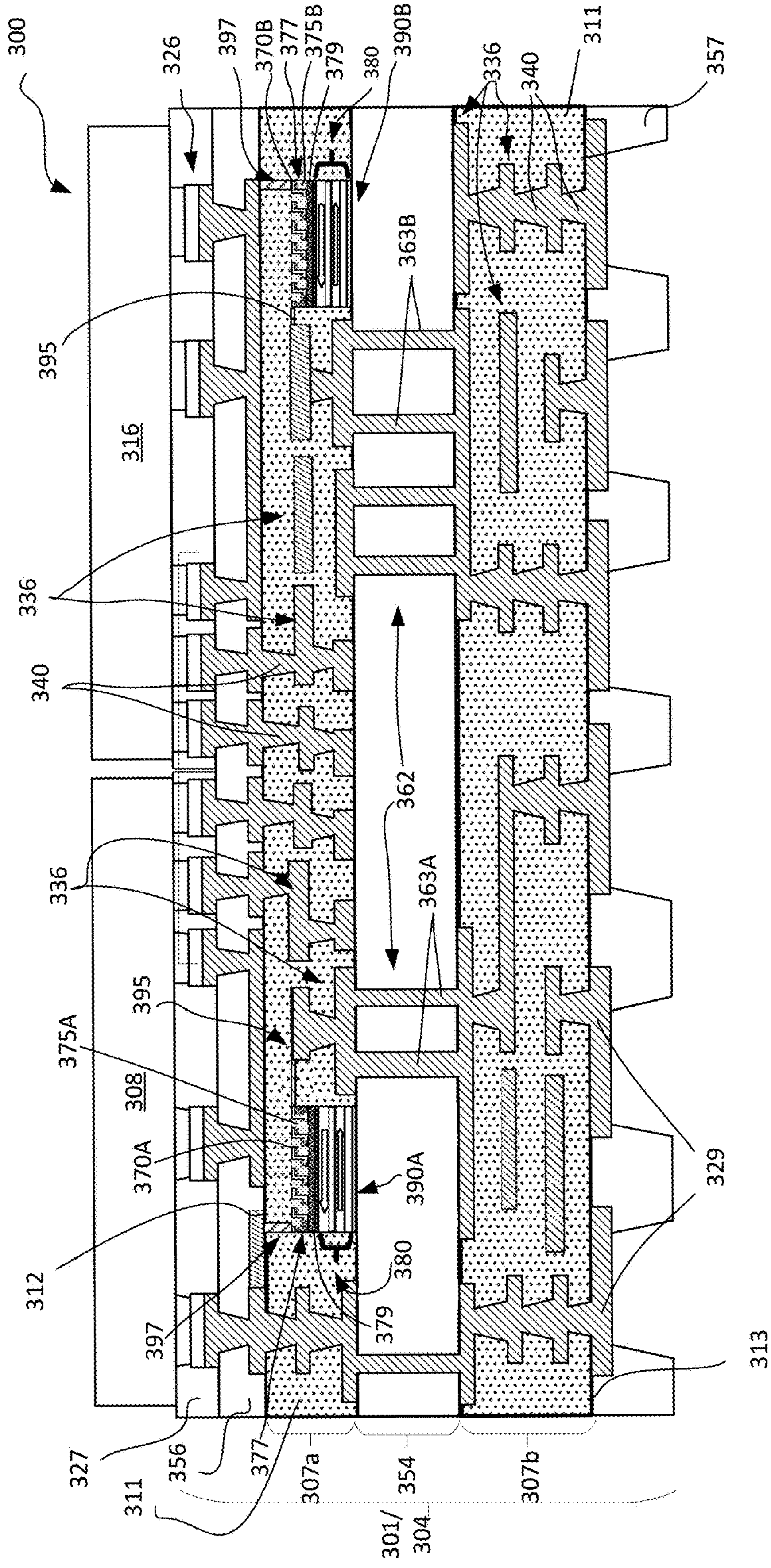
FIG. 3 is a cross sectional view of a microelectronic structure including the planar inductor according to a second embodiment.
Figure 4:
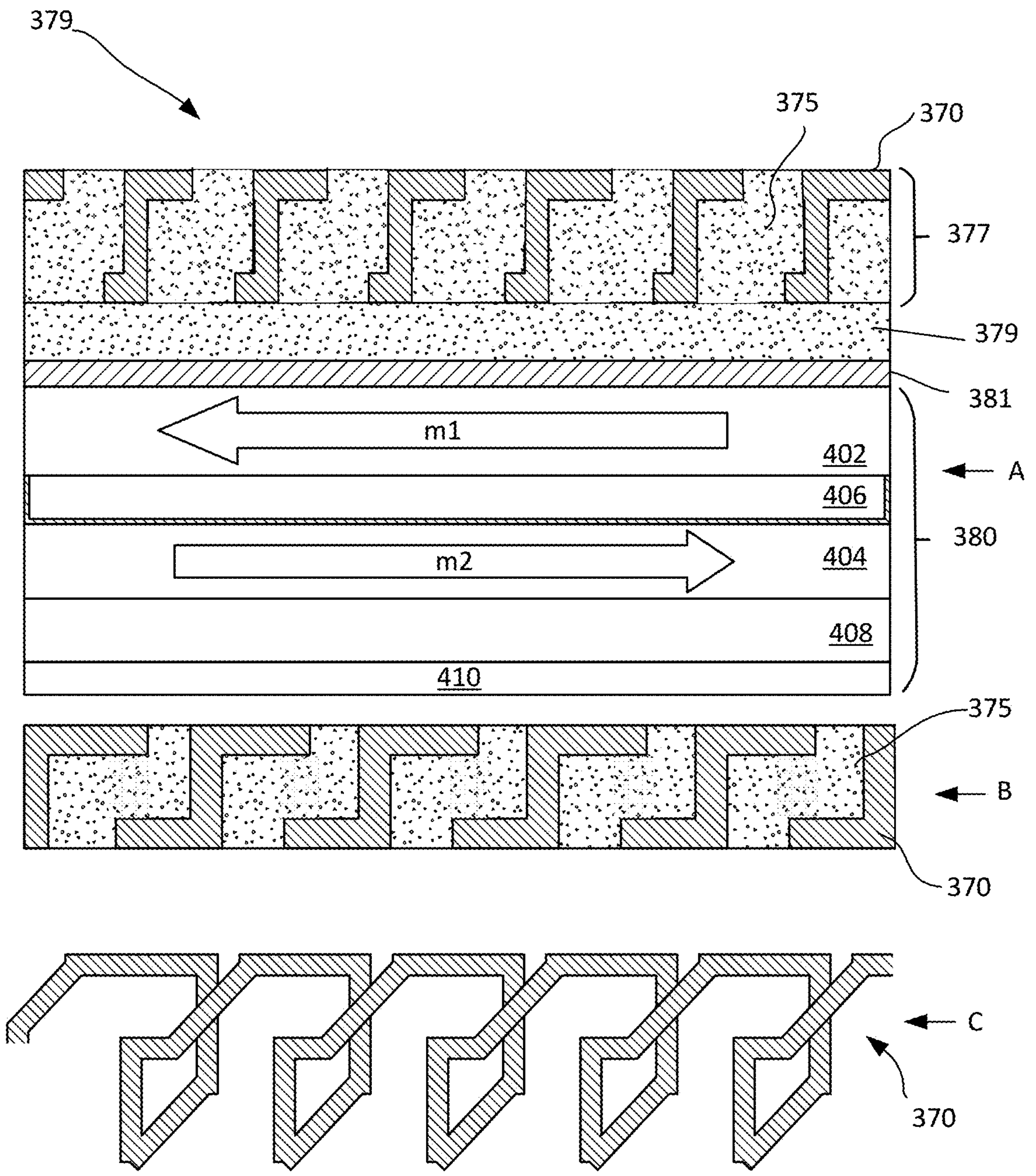
FIG. 4 is a cross sectional view of the planar inductor of FIG. 3.
Figure 5:
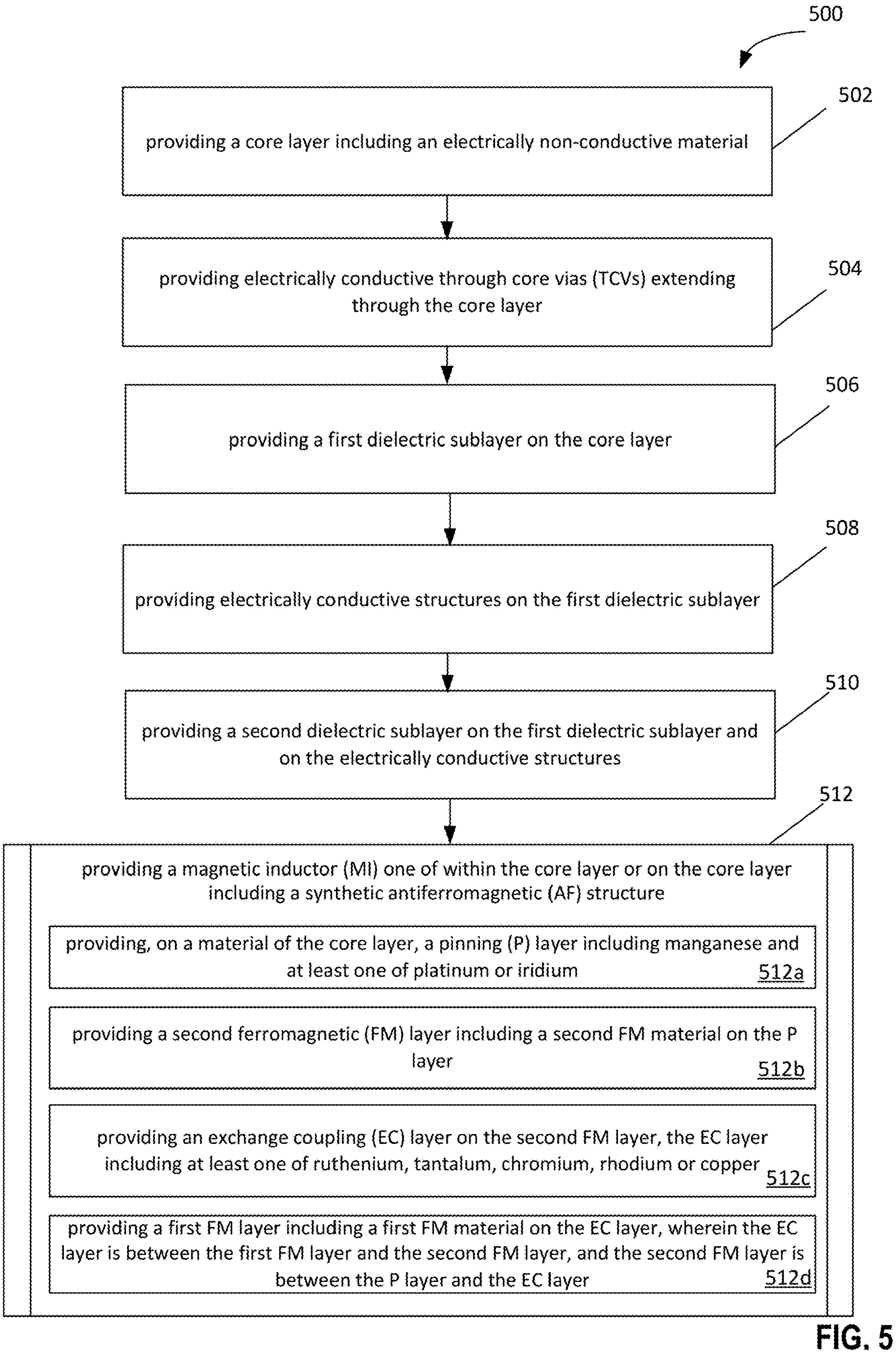
FIG. 5 is a flow chart of a process according to some embodiments.

Many of the elements of the semiconductor package 100 of FIG. 1 or 200 of FIG. 2 are included in other ones of the accompanying drawings relating to some embodiments, for example FIGS. 3, 4 and 5. A description of some elements may therefore not be repeated when discussing the drawings to be described below, and any of these elements may take any of the forms disclosed herein.

FIG. 3 is a cross-sectional view of a second embodiment of a microelectronic assembly 300 that includes a package substrate 304 or microelectronic structure 301. Microelectronic assembly 300 further includes dies 308 and 316, similar to dies 108 and 116, coupled to the package substrate 304.

Package substrate 304 may in general be similar in its structure to that of substrate 104 of FIG. 1, except for the configuration of the MIs therein. Substrate 304 includes a core 354 and build-up layers 307*a* and 307*b*, along with planar MIs 390A and 390B integrated or embedded therein. The package substrate 304, in the shown example, corresponds to an example of a "microelectronic structure" 301 as referred to herein.

The core layer 354 may include a non-conductive layer as well. The non-conductive layers may include a non-conductive material, such as glass, silicon or an organic material. A glass core as compared to a conventional epoxy core may offer several advantages including a higher plated through hole (PTH) density, lower signal losses, lower total thickness variation (TTV), among others.

The build-up layers may include successive non-conductive layers and successive metal layers (or redistribution layers (RDLs); e.g. M1, M2, . . . Mn) between the dielectric layers. RDLs include horizontally extending electrically conductive structures 336 extending through the sublayers to conduct electrical signals therethrough. Persons with skill in the art may appreciate that the distinctions in the various build-up layers attributed to the build-up layers 307*a*-307*b* in this discussion have been introduced for illustrative purposes; in a cross-sectional image of the substrate 304, such as by a transmission electron microscope (TEM), the layers 307*a*-307*b* may each include multiple layers, and/or may be different from the ones shown in the figure, and there may be more or less of the build-up layers than the ones shown.

Electrically conductive structures within the package substrate 304 provide signal communication for dies, such as dies 108 and 116 of FIG. 1, to be coupled to a top surface of the package substrate 304. Electrically conductive structures of the substrate 304 may include RDLs in the form of horizontally extending electrically conductive structures (including for example contacts) 336, and vias 340. Horizontally extending electrically conductive structures 336 may be arranged to route electrical signals in a horizontal direction, and vias 340 may be arranged to route electrical signals in a vertical direction. The electrically conductive structures may include an electrically conductive material such as a metal (e.g., copper, aluminum, nickel, cobalt, iron, tin, gold, silver, or combinations thereof).

Package substrate 304 may further include a passivation layer (not shown) in the form of solder resist or other dielectric material on the upper substrate surface 312 of substrate 304 may be patterned with respective pinouts (physical arrangement of conductive contacts at a respective pitch) for individual dies.

Package substrate 304 may also include a passivation layer (not shown) in the form of solder resist or other dielectric material on the lower substrate surface 313 of substrate 304 may also be patterned with a respective pinouts (physical arrangement of conductive contacts at a respective pitch) for electrical coupling of the microelectronic structure 301 to another component, such as a motherboard. The buildup layers may further include non-conductive layers 311 within which the horizontally extending electrically conductive structures 336 and vias 340 may be embedded. The non-conductive material may include a dielectric material.

Substrate 304 as shown corresponds to a microelectronic structure 301 that may include a core layer 354 as noted. There are through core vias (TCVs) 362 penetrating through the core layer 354 and electrically connecting the plurality of RDLs within the build-up layers 307*a* and 307*b* across the core layer 354. The through-vias 362 correspond to through-core vias (TCVs), which in turn are an example of Tsub Vs.

The core layer 354 may be a core substrate, and may be disposed in a center region of the substrate 304 in between build-up layers. The core layer 354 may have a similar configuration, including any of the same materials, already described above in relation to core layer 154.

Although the package substrate of FIG. 3 is shown as one that includes a core layer, embodiments are not so limited, and include within their scope a package substrate without a core, such as one including silicon.

The microelectronic structure 301 of FIG. 3 may be attached and electrically coupled to a circuit board (not shown) in the same manner as already described above in relation to FIG. 1.

In some embodiments, the package substrate 304 may be formed in the same manner as the package substrate 104 of FIG. 1, except for the provision of the planar MIs therein.

The package substrate 304 includes integrated planar MIs 390A and 390B (planar MIs 390) which are integrated into the package structure. The structure of the planar MIs 390A and 390B will be described in more detail in the context of FIG. 4.

The planar MIs 390A and 390B may improve the performance of the microelectronic structure 301 by more efficiently delivering power across the core layer 354 to the one or more dies to be coupled to a top surface of the package substrate 304.

Planar MI 390 may include respective coils 370A and 370B, the coils surrounding one or more respective non-conductive layers 375A and 375B. The coils 370A and 370B extend at least partially along a length (e.g., x-length) of the non-conductive layers 375. The coils 370 may be electrically coupled to one another, although embodiments are not so limited. The package substrate 304 includes electrically conductive pathways 395 that electrically couple individual ones of the coils 370A and 370B to the TCVs 362 at one end of the coils, and, in addition, electrically conductive pathways 397 that electrically couple individual ones of the coils 370A and 370B at another end of the coils to other electrically conductive pathways of the package substrate 304 to allow current to flow through the coils.

Package substrate 304 may further include a passivation layer 356 in the form of solder resist or other dielectric material on the upper substrate surface 312 of substrate 304 may be patterned with respective pinouts (physical arrangement of conductive contacts 326 at a respective pitch) for individual dies such as dies 308 and 316.

Package substrate 304 may also include a passivation layer 357 in the form of solder resist or other dielectric material on the lower substrate surface 313 of substrate 304 may also be patterned with a respective pinouts (physical arrangement of conductive contacts 329 at a respective pitch) for electrical coupling of the microelectronic assembly 300 to another component, such as a motherboard.

The microelectronic assembly 300 of FIG. 3 may also include an underfill material 327.

Reference is now made to both FIGS. 3 and 4. FIG. 4 shows the synthetic AF structure 380 of FIG. 3, for either of MIs 390A or 390B.

It is to be understood that embodiments encompass planar MIs 390A and 390B that are not identical to one another.

As best seen in FIG. 4, where a side cross sectional view of a planar MI 390 is seen in view A, a top plan view of the MI 390 is seen in view B, and a perspective view of the coil 370 is seen in view C of FIG. 4. Coil 370 in the shown example is a solenoid coil, although embodiments are not so limited. The coil for a planar MI according to embodiments may define any coil shape or coil pattern, such as a solenoidal core, a flat spiral coil, a cable coil, etc. "Solenoidal" as used herein is not meant to limit a description of a coil embodiment to one where the coil defines a smooth, cylindrical spiral pattern along its length, but includes within its scope a coil shape where the coil includes bends or corners, as for example depicted in view C of FIG. 4.

The coil 370 surrounds a non-conductive layer 375 (such as a dielectric layer), the combination of the coil 370 and non-conductive layer 375 forming a coil assembly 377. Coil assembly 377 rests on another dielectric layer 379, which provides electrical insulation between the coil 370 and an electrically conductive layer/electrode layer 381. Electrically conductive layer 381 is provided on synthetic AF structure 380 of the planar MI 390.

According to one embodiment that is not shown, the coil 370 may surround the AF structure 380 in the same manner as it is shown as surrounding non-conductive layer 375.

Synthetic AF structure 380 may, similar to the synthetic AF structure of FIG. 2 described in the context of a coaxial MI 190, according to some embodiments, include a multilayer structure to be placed in the proximity of coil assembly 377. The multilayer structure may include, according to some embodiments, two FM layers 402 and 404, each of the FM layers including a FM material, and an EC layer 406 between the two FM layers, such as in contact with the two FM layers. Individual ones of the FM layers 402 and 404 may include any FM material. Individual ones of the synthetic AF structures 380 may further include a P layer 408. Individual ones of the synthetic AF structures 380 may further include a seed layer 410. Individual ones of the synthetic AF structures 380 further include an electrode layer 381 between the coil assembly 377 and the synthetic AF structure 380. The possible materials for the FM layers, for the EC layer, for the P layer and for the seed layer of the synthetic AF structure 380 may include, the same materials as already listed above for synthetic AF structure 180 of FIGS. 1 and 2. The synthetic AF structure 380 may be formed using any suitable process.

The planar MIs 390 may, according to one embodiment, be patterned into non-conductive layers 311, preferably the non-conductive layers 311 adjacent a surface of the core layer 354. In the case of the latter, an electrically conductive material of the planar MI 390 may be integral with (form a one-piece structure with) an electrically conductive material of at least one portion of the RDL into which the planar MI 390 is patterned.

According to another embodiment, the planar MI 390 may be provided inside a cavity defined in core layer 354. In such a case, no part of the planar MI 390 is integral with any RDL of the package substrate 304.

In operation, a planar MI, such as planar MI 390, when an electrical current flows through an associated electrically conductive structure, such as coil 370 from one end of the coil coupled to electrically conductive pathway 395 to another end of the coil coupled to electrically conductive pathway 397, the synthetic AF 380 will be exposed to a magnetic field M caused by the electrical current. The magnetic field M from the current flow through the coil 370 has a direction that depends on the direction of current flow through the solenoidal coil (e.g., based on the right hand rule) may result in an increase in the magnetic flux density and an associated increase (from zero) in the magnetic field strength of the synthetic AF structure, and may change and eventually reverse/flip the magnetization direction of m1 of first FM layer 202 (the changing of magnetization direction of m1 in the first FM layer 202 contributes to impart a magnetic field to the synthetic AF structure 380, the absolute value of which is larger than zero).

It is repeated here that, as described herein, an increase in the magnetic flux density and/or in the magnetic field strength and/or in the magnetic saturation point of the synthetic AF is to refer to an increase in absolute value (e.g., electrical current flow in one direction may cause a decrease in magnetic flux density, and an attendant decrease in magnetic field strength, but only in terms of their sign (going below zero), but not in terms of their absolute values).

The increase may happen, similar to the mechanism already explained in relation to the coaxial MI above in FIG. 1, until saturation of the magnetic field strength of the synthetic AF structure 380 is reached. This increase results in enhanced power delivery and enhanced current flow in the electrically conductive pathway that is associated with the MI. As seen in FIG. 3, an electrically conductive pathway associated with a respective one of the planar MIs 390A and 390B (MI electrically conductive pathway), in the shown embodiment, includes first electrically conductive pathway 395 at one end of the coil, and second electrically conductive pathway 397 at another end of the coil which first and second electrically conductive pathways allow current flow through the coil. As noted herein, the electrically conductive pathways 395 and 397 may, if the planar MI is formed with the package substrate, be integral with the coil 370, and may, if the planar MI is inserted into a cavity of the package substrate, be coupled to (and thus distinct from) the coil 370.

The current flow through the coil (and hence through the MI electrically conductive pathway that encompasses the coil) represents at least partially the current flowing through the TCV 362 coupled to the planar MI 390. Namely, current flow through the coil 370A represents at least partially the current flowing through the TCVs 363A coupled to the planar MI 390A, and current flow through the coil 370B represents at least partially the current flowing through the TCVs 363B coupled to the planar MI 390B. Thus, the magnetic field M generated as a result of current flowing through the coils 370 enhances the power delivery through the TCVs 363A and 363B by virtue of affecting the magnetic field of the synthetic AF structure 380 through the mechanism of affecting a change in magnetic flux density, magnetic field strength of the synthetic AF structure 380, and magnetization direction of m1 in the first FM layer 202.

The enhancement noted above in the power delivery and current flow in the MI electrically conductive pathway for a given MI is under the condition of a same voltage V across the electrically conductive structure, as between an instance where there is no synthetic AF structure coupled to the MI electrically conductive pathway, and where there is a synthetic AF structure coupled to the MI electrically conductive pathway, with the enhancement being related to the latter. In some embodiments, the electrical current through the TCVs is, on a per TCV basis, flow in a single direction, although embodiments are not so limited.

The synthetic AF structure allows, in some embodiments, a steeper slope between magnetic flex density on the x axis, and magnetic field strength on the y axis, so that, as the current passes through the coil, for a same voltage bias, the magnetic field strength of the synthetic AF structure may increase faster than the magnetic field strength of a same structure but with a state of the art magnetic material structure. In some embodiments, the synthetic AF structure further allows the above referenced steeper slope while ensuring that the magnetic saturation threshold is kept high for the synthetic AF structure (e.g., is not reached quickly because of the steeper slope). A higher magnetic permeability of the synthetic AF structure as compared with traditional magnetic material structures of MIs can help provide for the higher magnetic saturation threshold. Some of the embodiments herein may achieve the above advantages while keeping the thickness of the synthetic AF relatively small, such as in the order of hundreds of nanometers, such as between about 50 nanometers to about 150 nanometers, such as above 75 nanometers.

According to some embodiments, the ferromagnetic materials of the synthetic AF structure are oriented with respect to the EC layer, the PL, and the electrically conductive structure (TCV) such that the hard axes of the FM layers is substantially parallel to an anticipated generation direction (e.g., as seen in FIG. 4, moving horizontally between the left side of coil 370 and the right side of coil 370) of current flow within the coil.

According to some embodiments, the core includes a glass material. Some embodiments however include within their scope the provision of a core including an organic material such as one including a polymer material and fibers therein, or the provision of a core including a silicon material. An advantage of a glass core is that it facilitates the provision of planar MIs thereon by virtue of a relative smoothness of the glass upper or lower surfaces as compared with surfaces of cores made of other materials.

Some embodiments include the provision of a planar MI including a synthetic AF structure directly within a core layer, such as by providing a cavity in the core layer and placing the planar MI therein.

For the provisions of a planar MI in a glass material, laser etching using a laser sensitization technique may be performed to provide the cavity, for example in the same manner described above in the context of FIG. 1.

FIG. 5 is a flowchart of a process 500 according to some embodiments. At operation 502, the process includes providing a core layer including an electrically non-conductive material. At operation 504, the process includes providing electrically conductive through core vias (TCVs) extending through the core layer. At operation 506, the process includes providing a first dielectric sublayer on the core layer. At operation 508, the process includes providing electrically conductive structures on the first dielectric sublayer. At operation 510, the process includes providing a second dielectric sublayer on the first dielectric sublayer and on the electrically conductive structures. At operation 512, the process includes providing a magnetic inductor (MI) one of within the core layer or on the core layer including an antiferromagnetic (AF) structure. Providing the MI includes, at operation 512*a*, providing, on a material of the core layer, a pinning (P) layer including manganese and at least one of platinum or iridium; providing at operation 512*b*, a second ferromagnetic (FM) layer including a second FM material on the P layer; providing at operation 512*c*, an exchange coupling (EC) layer on the second FM layer, the EC layer including a non-magnetic metal material, for example at least one of ruthenium, tantalum, chromium, rhodium or copper; and providing at operation 512*d*, a first FM layer including a first FM material on the EC layer, wherein the EC layer is between the first FM layer and the second FM layer, and the second FM layer is between the P layer and the EC layer. According to one embodiment, the EC layer may have a thickness between about 4 Angstroms and about 22 Angstroms, such as between about 4 Angstroms and about 12 Angstroms, or such as between about 16 Angstroms and about 22 Angstroms.

Figure 6:
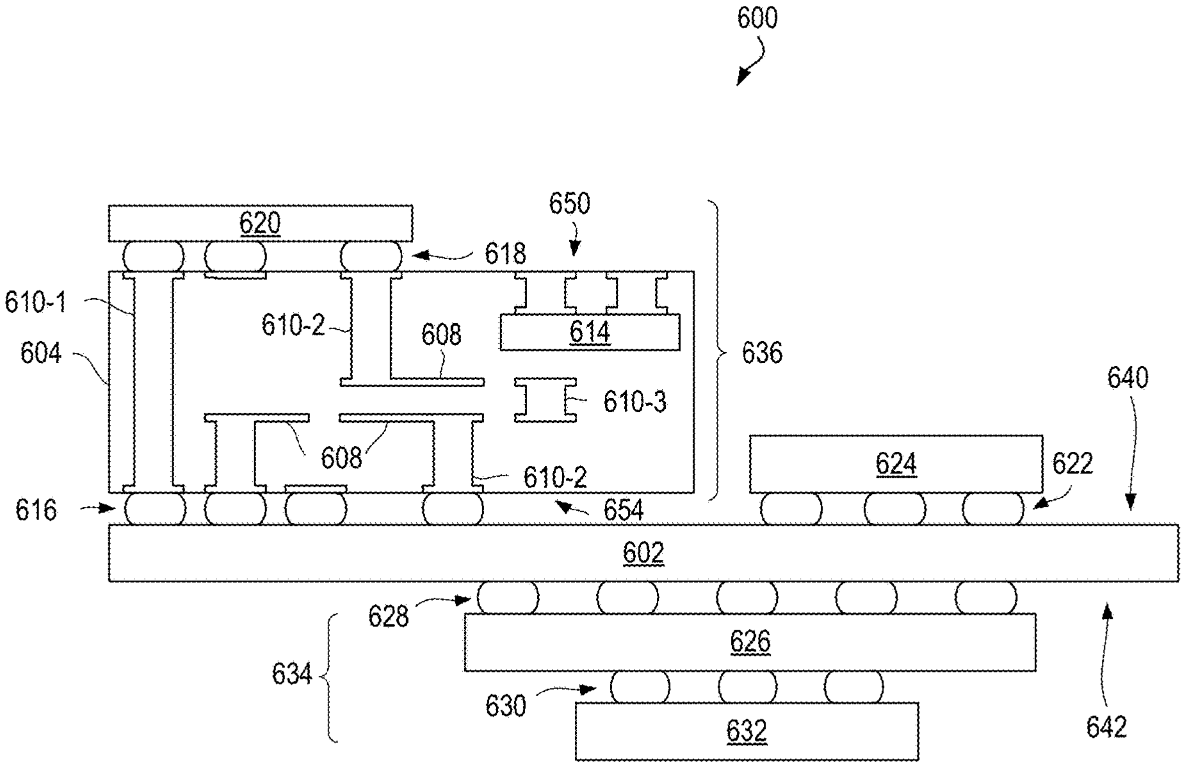
FIG. 6 is a cross-sectional side view of an integrated circuit device assembly that may include a microelectronic structure in accordance with any of the embodiments disclosed herein.

FIG. 6 is a cross-sectional side view of an integrated circuit device assembly 600 that may include one or more integrated circuit structures each including any of the microelectronic assemblies such as semiconductor packages of embodiments described herein. The integrated circuit device assembly 600 includes a number of components disposed on a circuit board 602 (which may be a motherboard, system board, mainboard, etc.). The integrated circuit device assembly 600 includes components disposed on a first face 640 of the circuit board 602 and an opposing second face 642 of the circuit board 602; generally, components may be disposed on one or both faces 640 and 642. Any of the integrated circuit components discussed below with reference to the integrated circuit device assembly 600 may include an integrated circuit structure including an interconnect structure as described herein.

In some embodiments, the circuit board 602 may be a printed circuit board (PCB) including multiple metal (or interconnect) layers separated from one another by layers of dielectric material and interconnected by electrically conductive vias. The individual metal layers comprise horizontally extending electrically conductive pathways. Any one or more of the metal layers may be formed in a desired circuit pattern to route electrical signals (optionally in conjunction with other metal layers) between the components coupled to the circuit board 602. In other embodiments, the circuit board 602 may be a non-PCB substrate. The integrated circuit device assembly 600 illustrated in FIG. 6 includes a package-on-interposer structure 636 coupled to the first face 640 of the circuit board 602 by coupling components 616. The coupling components 616 may electrically and mechanically couple the package-on-interposer structure 636 to the circuit board 602, and may include solder balls (as shown in FIG. 6), pins (e.g., as part of a pin grid array (PGA), contacts (e.g., as part of a land grid array (LGA)), male and female portions of a socket, an adhesive, an underfill material, and/or any other suitable electrical and/or mechanical coupling structure.

The package-on-interposer structure 636 may include an integrated circuit component 620 coupled to an interposer 604 by coupling components 618. The coupling components 618 may take any suitable form for the application, such as the forms discussed above with reference to the coupling components 616. Although a single integrated circuit component 620 is shown in FIG. 6, multiple integrated circuit components may be coupled to the interposer 604; indeed, additional interposers may be coupled to the interposer 604. The interposer 604 may provide an intervening substrate used to bridge the circuit board 602 and the integrated circuit component 620.

The integrated circuit component 620 may be a packaged or unpackaged integrated circuit product that includes one or more integrated circuit dies. A packaged integrated circuit component comprises one or more integrated circuit dies mounted on a package substrate with the integrated circuit dies and package substrate encapsulated in a casing material, such as a metal, plastic, glass, or ceramic. In one example of an unpackaged integrated circuit component 620, a single monolithic integrated circuit die comprises solder bumps attached to contacts on the die. The solder bumps allow the die to be directly attached to the interposer 604. The integrated circuit component 620 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the integrated circuit component 620 can comprise one or more additional active or passive devices such as capacitors, decoupling capacitors, resistors, inductors, fuses, diodes, transformers, sensors, electrostatic discharge (ESD) devices, and memory devices.

In embodiments where the integrated circuit component 620 comprises multiple integrated circuit dies, the dies can be of the same type (a homogeneous multi-die integrated circuit component) or of two or more different types (a heterogeneous multi-die integrated circuit component). A multi-die integrated circuit component can be referred to as a multi-chip package (MCP) or multi-chip module (MCM).

In addition to comprising one or more processor units, the integrated circuit component 620 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Generally, the interposer 604 may spread connections to a wider pitch or reroute a connection to a different connection. For example, the interposer 604 may couple the integrated circuit component 620 to a set of ball grid array (BGA) conductive contacts of the coupling components 616 for coupling to the circuit board 602. In the embodiment illustrated in FIG. 6, the integrated circuit component 620 and the circuit board 602 are attached to opposing sides of the interposer 604; in other embodiments, the integrated circuit component 620 and the circuit board 602 may be attached to a same side of the interposer 604. In some embodiments, three or more components may be interconnected by way of the interposer 604.

In some embodiments, the interposer 604 may be formed as a PCB, including multiple metal layers separated from one another by layers of dielectric material and interconnected by electrically conductive vias. In some embodiments, the interposer 604 may be formed of an epoxy resin, a fiberglass-reinforced epoxy resin, an epoxy resin with inorganic fillers, a ceramic material, or a polymer material such as polyimide. In some embodiments, the interposer 604 may be formed of alternate rigid or flexible materials that may include the same materials described above for use in a semiconductor substrate, such as silicon, germanium, and other group III-V and group IV materials. The interposer 604 may include metal interconnects 608 and vias 610, including but not limited to through hole vias 610-1 (that extend from a first face 650 of the interposer 604 to a second face 654 of the interposer 604), blind vias 610-2 (that extend from the first or second faces 650 or 654 of the interposer 604 to an internal metal layer), and buried vias 610-3 (that connect internal metal layers).

In some embodiments, the interposer 604 can comprise a silicon interposer. Through silicon vias (TSV) extending through the silicon interposer can connect connections on a first face of a silicon interposer to an opposing second face of the silicon interposer. In some embodiments, an interposer 604 comprising a silicon interposer can further comprise one or more routing layers to route connections on a first face of the interposer 604 to an opposing second face of the interposer 604.

The interposer 604 may further include embedded devices 614, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 604. The package-on-interposer structure 636 may take the form of any of the package-on-interposer structures known in the art. In embodiments where the interposer is a non-printed circuit board The integrated circuit device assembly 600 may include an integrated circuit component 624 coupled to the first face 640 of the circuit board 602 by coupling components 622. The coupling components 622 may take the form of any of the embodiments discussed above with reference to the coupling components 616, and the integrated circuit component 624 may take the form of any of the embodiments discussed above with reference to the integrated circuit component 620.

The integrated circuit device assembly 600 illustrated in FIG. 6 includes a package-on-package structure 634 coupled to the second face 642 of the circuit board 602 by coupling components 628. The package-on-package structure 634 may include an integrated circuit component 626 and an integrated circuit component 632 coupled together by coupling components 630 such that the integrated circuit component 626 is disposed between the circuit board 602 and the integrated circuit component 632. The coupling components 628 and 630 may take the form of any of the embodiments of the coupling components 616 discussed above, and the integrated circuit components 626 and 632 may take the form of any of the embodiments of the integrated circuit component 620 discussed above. The package-on-package structure 634 may be configured in accordance with any of the package-on-package structures known in the art.

Figure 7:
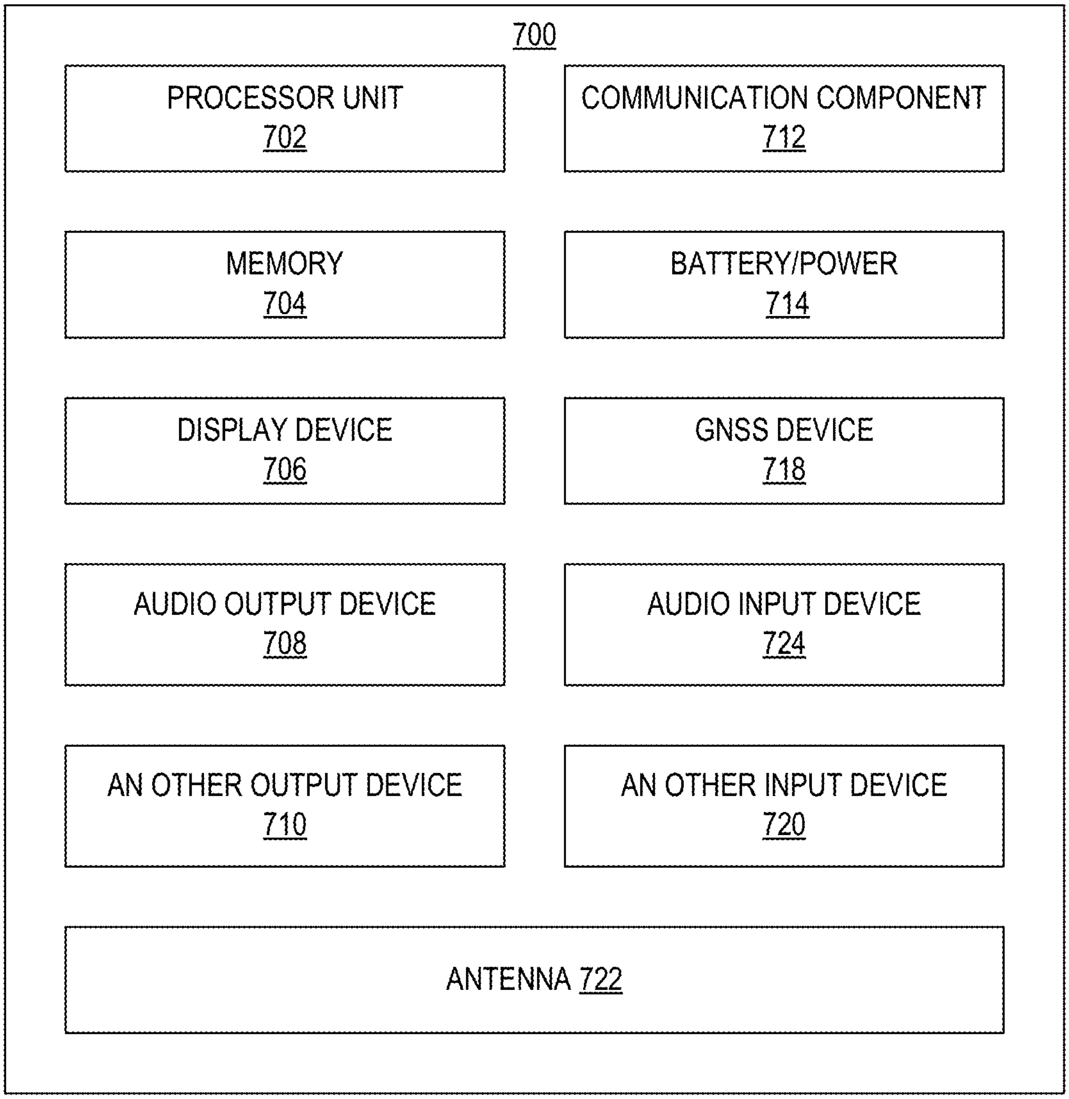
FIG. 7 is a block diagram of an example electrical device that may include a microelectronic structure, in accordance with any of the embodiments disclosed herein.

FIG. 7 is a block diagram of an example electrical device 700 that may include one or more of the embodiment semiconductor packages disclosed herein. For example, any suitable ones of the components of the electrical device 700 may include one or more of the integrated circuit device assemblies 600, integrated circuit components 620, and/or embodiment semiconductor packages disclosed herein. A number of components are illustrated in FIG. 7 as included in the electrical device 700, but any one or more of these components may be omitted or duplicated, as suitable for the application. In some embodiments, some or all of the components included in the electrical device 700 may be attached to one or more motherboards mainboards, or system boards. In some embodiments, one or more of these components are fabricated onto a single system-on-a-chip (SoC) die.

Additionally, in various embodiments, the electrical device 700 may not include one or more of the components illustrated in FIG. 7, but the electrical device 700 may include interface circuitry for coupling to the one or more components. For example, the electrical device 700 may not include a display device 706, but may include display device interface circuitry (e.g., a connector and driver circuitry) to which a display device 706 may be coupled. In another set of examples, the electrical device 700 may not include an audio input device 724 or an audio output device 708, but may include audio input or output device interface circuitry (e.g., connectors and supporting circuitry) to which an audio input device 724 or audio output device 708 may be coupled.

The electrical device 700 may include one or more processor units 702 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 702 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

The electrical device 700 may include a memory 704, which may itself include one or more memory devices such as volatile memory (e.g., dynamic random access memory (DRAM), static random-access memory (SRAM)), non-volatile memory (e.g., read-only memory (ROM), flash memory, chalcogenide-based phase-change non-voltage memories), solid state memory, and/or a hard drive. In some embodiments, the memory 704 may include memory that is located on the same integrated circuit die as the processor unit 702. This memory may be used as cache memory (e.g., Level 1 (L1), Level 2 (L2), Level 3 (L3), Level 4 (L4), Last Level Cache (LLC)) and may include embedded dynamic random access memory (eDRAM) or spin transfer torque magnetic random access memory (STT-MRAM).

In some embodiments, the electrical device 700 can comprise one or more processor units 702 that are heterogeneous or asymmetric to another processor unit 702 in the electrical device 700. There can be a variety of differences between the processing units 702 in a system in terms of a spectrum of metrics of merit including architectural, micro-architectural, thermal, power consumption characteristics, and the like. These differences can effectively manifest themselves as asymmetry and heterogeneity among the processor units 702 in the electrical device 700.

In some embodiments, the electrical device 700 may include a communication component 712 (e.g., one or more communication components). For example, the communication component 712 can manage wireless communications for the transfer of data to and from the electrical device 700. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 712 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 712 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 712 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 712 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 712 may operate in accordance with other wireless protocols in other embodiments. The electrical device 700 may include one or more antennas, such as antenna 722 to facilitate wireless communications and/or to receive other wireless communications (such as AM or FM radio transmissions).

In some embodiments, the communication component 712 may manage wired communications, such as electrical, optical, or any other suitable communication protocols (e.g., IEEE 802.3 Ethernet standards). As noted above, the communication component 712 may include multiple communication components. For instance, a first communication component 712 may be dedicated to shorter-range wireless communications such as Wi-Fi or Bluetooth, and a second communication component 712 may be dedicated to longer-range wireless communications such as global positioning system (GPS), EDGE, GPRS, CDMA, WiMAX, LTE, EV- DO, or others. In some embodiments, a first communication component 712 may be dedicated to wireless communications, and a second communication component 712 may be dedicated to wired communications.

The electrical device 700 may include battery/power circuitry 714. The battery/power circuitry 714 may include one or more energy storage devices (e.g., batteries or capacitors) and/or circuitry for coupling components of the electrical device 700 to an energy source separate from the electrical device 700 (e.g., AC line power).

The electrical device 700 may include a display device 706 (or corresponding interface circuitry, as discussed above). The display device 706 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 700 may include an audio output device 708 (or corresponding interface circuitry, as discussed above). The audio output device 708 may include any embedded or wired or wirelessly connected external device that generates an audible indicator, such speakers, headsets, or earbuds.

The electrical device 700 may include an audio input device 724 (or corresponding interface circuitry, as discussed above). The audio input device 724 may include any embedded or wired or wirelessly connected device that generates a signal representative of a sound, such as microphones, microphone arrays, or digital instruments (e.g., instruments having a musical instrument digital interface (MIDI) output). The electrical device 700 may include a Global Navigation Satellite System (GNSS) device 718 (or corresponding interface circuitry, as discussed above), such as a Global Positioning System (GPS) device. The GNSS device 718 may be in communication with a satellite-based system and may determine a geolocation of the electrical device 700 based on information received from one or more GNSS satellites, as known in the art.

The electrical device 700 may include another output device 710 (or corresponding interface circuitry, as discussed above). Examples of the other output device 710 may include an audio codec, a video codec, a printer, a wired or wireless transmitter for providing information to other devices, or an additional storage device.

The electrical device 700 may include another input device 720 (or corresponding interface circuitry, as discussed above). Examples of the other input device 720 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 700 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra-mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 700 may be any other electronic device that processes data. In some embodiments, the electrical device 700 may comprise multiple discrete physical components. Given the range of devices that the electrical device 700 can be manifested as in various embodiments, in some embodiments, the electrical device 700 can be referred to as a computing device or a computing system.

FIG. 10 is a flow chart of a process 1000 according to some embodiments. At operation 1002, the process includes providing a plurality of first dies. At operation 1004, the process includes providing an encapsulation layer on the first dies to form first layer of the semiconductor subassembly. At operation 1006, the process includes providing a first dielectric layer over the first layer to form a first layer and first dielectric layer subassembly. At operation 1008, the process includes providing a passive heat spreader interposer. At operation 1010, the process includes providing a second dielectric layer on the passive heat spreader interposer to form a passive heat spreader interposer and second dielectric layer subassembly. At operation 1012, the process includes forming an interface layer between and mechanically bonding the passive heat spreader interposer and the first layer, the interface layer providing a direct dielectric-to-dielectric bond including a first dielectric sublayer directly adjacent the first layer and formed from the first dielectric layer, and a second dielectric sublayer directly adjacent the first dielectric sublayer, formed from the second dielectric layer, and including an amorphous material. At operation 1014, the process includes providing a second layer including a substrate. At operation 1016, the process includes electrically coupling the substrate to the first dies.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of embodiments has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

It will also be understood that, although the terms "first," "second," and so forth may be used herein to describe various elements, these elements should not be limited by these terms. These terms are only used to distinguish one element from another. For example, a first contact could be termed a second contact, and, similarly, a second contact could be termed a first contact, without departing from the scope of the present example embodiments. The first contact and the second contact are both contacts, but they are not the same contact.

As used in the description of the example embodiments and the appended examples, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

In embodiments, the phrase "A is located on B" means that at least a part of A is in direct physical contact or indirect physical contact (having one or more other features between A and B) with at least a part of B.

In the instant description, "A is adjacent to B" means that at least part of A is in direct physical contact with at least a part of B.

In the instant description, "B is between A and C" means that at least part of B is in or along a space separating A and C and that the at least part of B is in direct or indirect physical contact with A and C.

In the instant description, "A is attached to B" means that at least part of A is mechanically attached to at least part of B, either directly or indirectly (having one or more other features between A and B).

In the instant description, "the As are coupled to the Bs" means that at least some of the As are coupled to at least some of the Bs, and not necessarily that all As are coupled to at least one B and all Bs are coupled to at least one A.

In the instant description, "A is within B" means that at least some of A is encompassed within the physical boundaries of B.

The use of reference numerals separated by a "/", such as "102/104" for example, is intended to refer to 102 or 104 as appropriate. Otherwise, the forward slash ("/") as used herein means "and/or."

When used to describe a range of dimensions, the phrase "between X and Y" represents a range that includes X and Y. For convenience, the phrase "FIG. 2" may be used to refer to the collection of drawings of FIGS. 2A-2C, the phrase "FIG. 5" may be used to refer to the collection of drawings of FIGS. 5A-5I, etc. Although certain elements may be referred to in the singular herein, such elements may include multiple sub-elements. For example, "an insulating material" may include one or more insulating materials. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket, or portion of a conductive line or via).

The use of the techniques and structures provided herein can be detected using tools such as: electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, such tools can indicate an integrated circuit including at least one semiconductor package including an embedded magnetic inductor.

In some embodiments, the techniques, processes and/or methods described herein can be detected based on the structures formed therefrom. In addition, in some embodiments, the techniques and structures described herein can be detected based on the benefits derived therefrom. Numerous configurations and variations will be apparent in light of this disclosure.

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," "according to some embodiments," "in accordance with embodiments," or "in embodiments," which may each refer to one or more of the same or different embodiments. Furthermore, the terms "comprising," "including," "having," and the like, as used with respect to embodiments of the present disclosure, are synonymous.

"Coupled" as used herein means that two or more elements are in direct physical contact, or that that two or more elements indirectly physically contact each other, but yet still cooperate or interact with each other (i.e. one or more other elements are coupled or connected between the elements that are said to be coupled with each other). The term "directly coupled" means that two or more elements are in direct contact.

As used herein, the term "module" refers to being part of, or including an ASIC, an electronic circuit, a system on a chip, a processor (shared, dedicated, or group), a solid state device, a memory (shared, dedicated, or group) that execute one or more software or firmware programs, a combinational logic circuit, and/or other suitable components that provide the described functionality.

As used herein, "electrically conductive" in some examples may refer to a property of a material having an electrical conductivity greater than or equal to 107 Siemens per meter (S/m) at 20 degrees Celsius. Examples of such materials include Cu, Ag, Al, Au, W, Zn and Ni.

In the corresponding drawings of the embodiments, signals, currents, electrical biases, or magnetic or electrical polarities may be represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, polarity, current, voltage, etc., as dictated by design needs or preferences, may actually comprise one or more signals that may travel in either direction and may be implemented with any suitable type of signal scheme.

Throughout the specification, and in the claims, the term “connected” means a direct connection, such as electrical, mechanical, or magnetic connection between the elements that are connected, without any intermediary devices. The term “coupled” means a direct or indirect connection, such as a direct electrical, mechanical, or magnetic connection between the elements that are connected or an indirect connection, through one or more passive or active intermediary devices. The term “signal” may refer to at least one current signal, voltage signal, magnetic signal, or data/clock signal. The meaning of “a,” “an,” and “the” include plural references. The meaning of “in” includes “in” and “on.”

The terms “substantially,” “close,” “approximately,” “near,” and “about,” generally refer to being within +/−10% of a target value (unless specifically specified). Unless otherwise specified the use of the ordinal adjectives “first,” “second,” and “third,” etc., to describe a common object, merely indicate that different instances of like objects are being referred to, and are not intended to imply that the objects so described must be in a given sequence, either temporally, spatially, in ranking or in any other manner, and are not intended to imply that the objects so described must necessarily be made of different materials or have different dimensions.

For purposes of the embodiments, any transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure. The term “MN” indicates an n-type transistor (e.g., nMOS, NPN BJT, etc.) and the term “MP” indicates a p-type transistor (e.g., pMOS, PNP BJT, etc.).

The foregoing description, for the purpose of explanation, has been described with reference to specific example embodiments. However, the illustrative discussions above are not intended to be exhaustive or to limit the possible example embodiments to the precise forms disclosed. Many modifications and variations are possible in view of the above teachings. The example embodiments were chosen and described in order to best explain the principles involved and their practical applications, to thereby enable others skilled in the art to best utilize the various example embodiments with various modifications as are suited to the particular use contemplated.

EXAMPLES

Some non-limiting example embodiments are set forth below.

Example 1 includes a microelectronic structure including: a core layer including an electrically non-conductive material; electrically conductive through core vias (TCVs) extending through the core layer; a build-up layer on the core layer and electrically coupled to the TCVs; and a magnetic inductor (MI) within at least one of the core layer or the build-up layer and including an antiferromagnetic (AF) structure, the AF structure including: a first ferromagnetic (FM) layer including a first FM material; an exchange coupling (EC) layer on the first FM layer and including a non-magnetic metal material; a second FM layer on the EC layer and including a second FM material, the EC layer between the first FM layer and the second FM layer; and a pinning (P) layer including manganese and at least one of platinum or iridium, the second FM layer between the EC layer and the P layer.

Example 2 includes the subject matter of Example 1, wherein the core layer includes one of glass, an organic material, or silicon, and wherein the non-magnetic metal material of the EC layer includes at least one of ruthenium, tantalum, chromium, rhodium or copper.

Example 3 includes the subject matter of Example 1, wherein the MI corresponds to a coaxial MI, the coaxial MI within the core layer and including a TCV of the TCVs, wherein the AF structure of the MI surround the TCV along at least a portion of a height thereof, the P layer being between the TCV and the second FM layer.

Example 4 includes the subject matter of Example 3, wherein the AF structure surrounds the TCV at least one of along substantially an entire height of the TCV or across substantially an entire perimeter of the TCV.

Example 5 includes the subject matter of Example 1, wherein the MI corresponds to a planar MI within the build-up layer, the planar MI including an electrically conductive coil extending along a length of the AF structure such that the first FM layer, the EC layer, and the second FM layer are between the coil and the P layer, wherein the coil and a TCV of the TCVs are electrically coupled to one another.

Example 6 includes the subject matter of Example 5, wherein the coil has one of a solenoidal shape or a flat shape.

Example 7 includes the subject matter of any one of Examples 5 and 6, wherein the P layer is between the core layer and the second FM layer Example 8 includes the subject matter of any one of Examples 1-7, wherein the first FM layer, the EC layer, the second FM layer and the P layer are substantially coextensive with one another along a length thereof.

Example 9 includes the subject matter of any one of Examples 1-8, wherein the AF structure further includes a seed layer including a metal, the P layer between the seed layer and the second FM layer.

Example 10 includes the subject matter of any one of Examples 1-9, wherein the first FM material and the second FM material correspond to a same material.

Example 11 includes the subject matter of any one of Examples 1-10, wherein individual ones of the first FM material and the second FM material include at least one of iron, cobalt or nickel.

Example 12 includes the subject matter of Example 11, wherein individual ones of the first FM material and the second FM material include iron and at least one of cobalt or nickel.

Example 13 includes the subject matter of Example 12, wherein individual ones of the first FM material and the second FM material include iron, boron, and at least one of cobalt or nickel.

Example 14 includes a microelectronic assembly including: a microelectronic structure including: a core layer including an electrically non-conductive material; electrically conductive through core vias (TCVs) extending through the core layer; a build-up layer on the core layer and electrically coupled to the TCVs; electrical contacts at a surface of the microelectronic structure; and a magnetic inductor (MI) within at least one of the core layer or the build-up layer and including an antiferromagnetic (AF) structure, the AF structure including: a first ferromagnetic (FM) layer including a first FM material; an exchange coupling (EC) layer on the first FM layer and including a non-magnetic metal material; a second FM layer on the EC layer and including a second FM material, the EC layer between the first FM layer and the second FM layer; and a pinning (P) layer including manganese and at least one of platinum or iridium, the second FM layer between the EC layer and the P layer; and a die electrically coupled to at least some of the electrical contacts.

Example 15 includes the subject matter of Example 14, wherein the core layer includes one of glass, an organic material, or silicon, and wherein the non-magnetic metal material of the EC layer includes at least one of ruthenium, tantalum, chromium, rhodium or copper.

Example 16 includes the subject matter of Example 14, wherein the MI corresponds to a coaxial MI, the coaxial MI within the core layer and including a TCV of the TCVs, wherein the AF structure of the MI surround the TCV along at least a portion of a height thereof, the P layer being between the TCV and the second FM layer.

Example 17 includes the subject matter of Example 16, wherein the AF structure surrounds the TCV at least one of along substantially an entire height of the TCV or across substantially an entire perimeter of the TCV.

Example 18 includes the subject matter of Example 14, wherein the MI corresponds to a planar MI within the build-up layer, the planar MI including an electrically conductive coil extending along a length of the AF structure such that the first FM layer, the EC layer, and the second FM layer are between the coil and the P layer, wherein the coil and a TCV of the TCVs are electrically coupled to one another.

Example 19 includes the subject matter of Example 18, wherein the coil has one of a solenoidal shape or a flat shape.

Example 20 includes the subject matter of any one of Examples 18 and 19, wherein the P layer is between the core layer and the second FM layer Example 21 includes the subject matter of any one of Examples 14-20, wherein the first FM layer, the EC layer, the second FM layer and the P layer are substantially coextensive with one another along a length thereof.

Example 22 includes the subject matter of any one of Examples 14-21, wherein the AF structure further includes a seed layer including a metal, the P layer between the seed layer and the second FM layer.

Example 23 includes the subject matter of any one of Examples 14-22, wherein the first FM material and the second FM material correspond to a same material.

Example 24 includes the subject matter of any one of Examples 14-23, wherein individual ones of the first FM material and the second FM material include at least one of iron, cobalt or nickel.

Example 25 includes the subject matter of Example 24, wherein individual ones of the first FM material and the second FM material include iron and at least one of cobalt or nickel.

Example 26 includes the subject matter of Example 25, wherein individual ones of the first FM material and the second FM material include iron, boron, and at least one of cobalt or nickel.

Example 27 includes an integrated circuit (IC) device assembly including: a printed circuit board; and a microelectronic assembly electrically coupled to the printed circuit board and including: a microelectronic structure including: a core layer including an electrically non-conductive material; electrically conductive through core vias (TCVs) extending through the core layer; a build-up layer on the core layer and electrically coupled to the TCVs; electrical contacts at a surface of the microelectronic structure; and a magnetic inductor (MI) within at least one of the core layer or the build-up layer and including an antiferromagnetic (AF) structure, the AF structure including: a first ferromagnetic (FM) layer including a first FM material; an exchange coupling (EC) layer on the first FM layer and including a non-magnetic metal material; a second FM layer on the EC layer and including a second FM material, the EC layer between the first FM layer and the second FM layer; and a pinning (P) layer including manganese and at least one of platinum or iridium, the second FM layer between the EC layer and the P layer; and a die electrically coupled to at least some of the electrical contacts of the microelectronic structure.

Example 28 includes the subject matter of Example 27, wherein the core layer includes one of glass, an organic material, or silicon, and wherein the non-magnetic metal material of the EC layer includes at least one of ruthenium, tantalum, chromium, rhodium or copper.

Example 29 includes the subject matter of Example 27, wherein the MI corresponds to a coaxial MI, the coaxial MI within the core layer and including a TCV of the TCVs, wherein the AF structure of the MI surround the TCV along at least a portion of a height thereof, the P layer being between the TCV and the second FM layer.

Example 30 includes the subject matter of Example 29, wherein the AF structure surrounds the TCV at least one of along substantially an entire height of the TCV or across substantially an entire perimeter of the TCV.

Example 31 includes the subject matter of Example 23, wherein the MI corresponds to a planar MI within the build-up layer, the planar MI including an electrically conductive coil extending along a length of the AF structure such that the first FM layer, the EC layer, and the second FM layer are between the coil and the P layer, wherein the coil and a TCV of the TCVs are electrically coupled to one another.

Example 32 includes the subject matter of Example 31, wherein the coil has one of a solenoidal shape or a flat shape.

Example 33 includes the subject matter of any one of Examples 31 and 32, wherein the P layer is between the core layer and the second FM layer.

Example 34 includes the subject matter of any one of Examples 27-33, wherein the first FM layer, the EC layer, the second FM layer and the P layer are substantially coextensive with one another along a length thereof.

Example 35 includes the subject matter of any one of Examples 27-34, wherein the AF structure further includes a seed layer including a metal, the P layer between the seed layer and the second FM layer.

Example 36 includes the subject matter of any one of Examples 27-35, wherein the first FM material and the second FM material correspond to a same material.

Example 37 includes the subject matter of any one of Examples 27-36, wherein individual ones of the first FM material and the second FM material include at least one of iron, cobalt or nickel.

Example 38 includes the subject matter of Example 37, wherein individual ones of the first FM material and the second FM material include iron and at least one of cobalt or nickel.

Example 39 includes the subject matter of Example 38, wherein individual ones of the first FM material and the second FM material include iron, boron, and at least one of cobalt or nickel.

Example 40 includes a method to fabricate a microelectronic structure, comprising: providing a core layer including an electrically non-conductive material; providing electrically conductive through core vias (TCVs) extending through the core layer; providing a first dielectric sublayer on the core layer; providing electrically conductive structures on the first dielectric sublayer; providing a second dielectric sublayer on the first dielectric sublayer and on the electrically conductive structures; and providing a magnetic inductor (MI) one of within the core layer or on the core layer including an antiferromagnetic (AF) structure including: providing, on a material of the core layer, a pinning (P) layer including manganese and at least one of platinum or iridium; providing a second ferromagnetic (FM) layer including a second FM material on the P layer; providing an exchange coupling (EC) layer on the second FM layer, the EC layer including a non-magnetic metal material; and providing a first FM layer including a first FM material on the EC layer, wherein the EC layer is between the first FM layer and the second FM layer, and the second FM layer is between the P layer and the EC layer.

Example 41 includes the subject matter of Example 40, wherein the core layer includes one of glass, an organic material, or silicon, and wherein the non-magnetic metal material of the EC layer includes at least one of ruthenium, tantalum, chromium, rhodium or copper.

Example 42 includes the subject matter of Example 40, wherein the MI corresponds to a coaxial MI, providing the coaxial MI including: providing a through via hole in the core layer; providing the AF structure on lateral walls of the through via hole such that the P layer is adjacent the lateral walls; and providing an electrically conductive material in the through via hole to form a TCV of the TCVs such that the AF structure surrounds the TCV along at least a portion of a height thereof.

Example 43 includes the subject matter of Example 42, wherein the AF structure surrounds the TCV at least one of along substantially an entire height of the TCV or across substantially an entire perimeter of the TCV.

Example 44 includes the subject matter of Example 40, wherein the MI corresponds to a planar MI, providing the planar MI within the build-up layer, the planar MI including an electrically conductive coil extending along a length of the AF structure such that the first FM layer, the EC layer, and the second FM layer are between the coil and the P layer, wherein the coil and a TCV of the TCVs are electrically coupled to one another.

Example 45 includes the subject matter of Example 44, wherein the coil has one of a solenoidal shape or a flat shape.

Example 46 includes the subject matter of any one of Examples 44 and 45, wherein the P layer is between the core layer and the second FM layer.

Example 47 includes the subject matter of any one of Examples 40-46, wherein the first FM layer, the EC layer, the second FM layer and the P layer are substantially coextensive with one another along a length thereof.

Example 48 includes the subject matter of any one of Examples 40-47, wherein providing the AF structure further includes providing a seed layer on the material of the core layer, the seed layer including a metal, the P layer between the seed layer and the second FM layer.

Example 49 includes the subject matter of any one of Examples 40-48, wherein the first FM material and the second FM material correspond to a same material.

Example 50 includes the subject matter of any one of Examples 40-49, wherein individual ones of the first FM material and the second FM material include at least one of iron, cobalt or nickel.

Example 51 includes the subject matter of Example 50, wherein individual ones of the first FM material and the second FM material include iron and at least one of cobalt or nickel.

Example 52 includes the subject matter of Example 51, wherein individual ones of the first FM material and the second FM material include iron, boron, and at least one of cobalt or nickel.

What is claimed is:

1. A microelectronic structure including:
- a core layer including an electrically non-conductive material;
- electrically conductive through core vias (TCVs) extending through the core layer;
- a build-up layer on the core layer and electrically coupled to the TCVs; and
- a magnetic inductor (MI) within at least one of the core layer or the build-up layer and including an antiferromagnetic (AF) structure, the AF structure including:
  - a first ferromagnetic (FM) layer including a first FM material;
  - an exchange coupling (EC) layer on the first FM layer and including a non-magnetic metal material;
  - a second FM layer on the EC layer and including a second FM material, the EC layer between the first FM layer and the second FM layer; and
  - a pinning (P) layer including manganese and at least one of platinum or iridium, the second FM layer between the EC layer and the Player.

2. The microelectronic structure of claim 1, wherein the core layer includes one of glass, an organic material, or silicon, and wherein the non-magnetic metal material of the EC layer includes at least one of ruthenium, tantalum, chromium, rhodium or copper.

3. The microelectronic structure of claim 1, wherein the MI corresponds to a coaxial MI, the coaxial MI within the core layer and including a TCV of the TCVs, wherein the AF structure of the MI surrounds the TCV along at least a portion of a height thereof, the Player being between the TCV and the second FM layer.

4. The microelectronic structure of claim 1, wherein the MI corresponds to a planar MI within the build-up layer, the planar MI including an electrically conductive coil extending along a length of the AF structure such that the first FM layer, the EC layer, and the second FM layer are between the coil and the Player, wherein the coil and a TCV of the TCVs are electrically coupled to one another.

5. The microelectronic structure of claim 1, wherein the first FM layer, the EC layer, the second FM layer and the P layer are substantially coextensive with one another along a length thereof.

6. The microelectronic structure of claim 1, wherein the AF structure further includes a seed layer including a metal, the Player between the seed layer and the second FM layer.

7. The microelectronic structure of claim 1, wherein the first FM material and the second FM material correspond to a same material.

8. The microelectronic structure of claim 1, wherein individual ones of the first FM material and the second FM material include at least one of iron, cobalt or nickel.

9. The microelectronic structure of claim 8, wherein individual ones of the first FM material and the second FM material include iron and at least one of cobalt or nickel.

10. The microelectronic structure of claim 9, wherein individual ones of the first FM material and the second FM material include iron, boron, and at least one of cobalt or nickel.

11. A microelectronic assembly including:
a microelectronic structure including:
a core layer including an electrically non-conductive material;
electrically conductive through core vias (TCVs) extending through the core layer;
a build-up layer on the core layer and electrically coupled to the TCVs;
electrical contacts at a surface of the microelectronic structure; and
a magnetic inductor (MI) within at least one of the core layer or the build-up layer and including an antiferromagnetic (AF) structure, the AF structure including:
a first ferromagnetic (FM) layer including a first FM material;
an exchange coupling (EC) layer on the first FM layer and including a non-magnetic metal material;
a second FM layer on the EC layer and including a second FM material, the EC layer between the first FM layer and the second FM layer; and
a pinning (P) layer including manganese and at least one of platinum or iridium, the second FM layer between the EC layer and the Player; and
a die electrically coupled to at least some of the electrical contacts.

12. The microelectronic assembly of claim 11, wherein the MI corresponds to a coaxial MI, the coaxial MI within the core layer and including a TCV of the TCVs, wherein the AF structure of the MI surrounds the TCV along at least a portion of a height thereof, the Player being between the TCV and the second FM layer.

13. The microelectronic assembly of claim 11, wherein the MI corresponds to a planar MI within the build-up layer, the planar MI including an electrically conductive coil extending along a length of the AF structure such that the first FM layer, the EC layer, and the second FM layer are between the coil and the Player, wherein the coil and a TCV of the TCVs are electrically coupled to one another.

14. An integrated circuit (IC) device assembly including:
a printed circuit board; and
a microelectronic assembly electrically coupled to the printed circuit board and including:
a microelectronic structure including:
a core layer including an electrically non-conductive material;
electrically conductive through core vias (TCVs) extending through the core layer;
a build-up layer on the core layer and electrically coupled to the TCVs;
electrical contacts at a surface of the microelectronic structure; and
a magnetic inductor (MI) within at least one of the core layer or the build-up layer and including an antiferromagnetic (AF) structure, the AF structure including:
a first ferromagnetic (FM) layer including a first FM material;
an exchange coupling (EC) layer on the first FM layer and including a non-magnetic metal material;
a second FM layer on the EC layer and including a second FM material, the EC layer between the first FM layer and the second FM layer; and
a pinning (P) layer including manganese and at least one of platinum or iridium, the second FM layer between the EC layer and the Player; and
a die electrically coupled to at least some of the electrical contacts of the microelectronic structure.

15. The IC device assembly of claim 14, wherein the MI corresponds to a coaxial MI, the coaxial MI within the core layer and including a TCV of the TCVs, wherein the AF structure of the MI surrounds the TCV along at least a portion of a height thereof, the P layer being between the TCV and the second FM layer.

16. The IC device assembly of claim 14, wherein the MI corresponds to a planar MI within the build-up layer, the planar MI including an electrically conductive coil extending along a length of the AF structure such that the first FM layer, the EC layer, and the second FM layer are between the coil and the Player, wherein the coil and a TCV of the TCVs are electrically coupled to one another.

17. A method to fabricate a microelectronic structure, comprising:
providing a core layer including an electrically non-conductive material;
providing electrically conductive through core vias (TCVs) extending through the core layer;
providing a first dielectric sublayer on the core layer;
providing electrically conductive structures on the first dielectric sublayer;
providing a second dielectric sublayer on the first dielectric sublayer and on the electrically conductive structures; and
providing a magnetic inductor (MI) one of within the core layer or on the core layer, the MI including an antiferromagnetic (AF) structure including:
providing, on a material of the core layer, a pinning (P) layer including manganese and at least one of platinum or iridium;
providing a second ferromagnetic (FM) layer including a second FM material on the P layer;
providing an exchange coupling (EC) layer on the second FM layer, the EC layer including a non-magnetic metal material; and
providing a first FM layer including a first FM material on the EC layer, wherein the EC layer is between the first FM layer and the second FM layer, and the second FM layer is between the Player and the EC layer.

18. The method of claim 17, wherein the core layer includes one of glass, an organic material, or silicon, and wherein the non-magnetic metal material of the EC layer includes at least one of ruthenium, tantalum, chromium, rhodium or copper.

19. The method of claim 17, wherein the MI corresponds to a coaxial MI, providing the coaxial MI including:

providing a through via hole in the core layer;

providing the AF structure on lateral walls of the through via hole such that the Player is adjacent the lateral walls; and providing an electrically conductive material in the through via hole to form a TCV of the TCVs such that the AF structure surrounds the TCV along at least a portion of a height thereof.

20. The method of claim 17, wherein the MI corresponds to a planar MI, providing the planar MI within the build-up layer, the planar MI including an electrically conductive coil extending along a length of the AF structure such that the first FM layer, the EC layer, and the second FM layer are between the coil and the Player, wherein the coil and a TCV of the TCVs are electrically coupled to one another.

* * * * *